United States Patent
Agarwal et al.

(10) Patent No.: US 10,153,046 B1
(45) Date of Patent: Dec. 11, 2018

(54) NON-VOLATILE MEMORY WITH BACKING UP OF PROGRAMMED DATA

(71) Applicant: Western Digital Technologies, Inc., San Jose, CA (US)

(72) Inventors: Dinesh Agarwal, Bangalore (IN); Hitesh Golechchha, Bangalore (IN)

(73) Assignee: Western DigitalTechnologies, Inc., San Jose, CA (US)

( * ) Notice: Subject to any disclaimer, the term of this patent is extended or adjusted under 35 U.S.C. 154(b) by 0 days.

(21) Appl. No.: 15/798,009

(22) Filed: Oct. 30, 2017

(51) Int. Cl.
| | | |
|---|---|---|
| G11C 16/06 | (2006.01) | |
| G11C 16/10 | (2006.01) | |
| G11C 16/16 | (2006.01) | |
| G11C 16/34 | (2006.01) | |
| G11C 16/04 | (2006.01) | |

(52) U.S. Cl.
CPC ........ G11C 16/107 (2013.01); G11C 16/0483 (2013.01); G11C 16/16 (2013.01); G11C 16/3427 (2013.01); G11C 16/3431 (2013.01)

(58) Field of Classification Search
CPC ... G06F 12/0246; G06F 11/1068; G06F 3/064
See application file for complete search history.

(56) References Cited

U.S. PATENT DOCUMENTS

| | | |
|---|---|---|
| 5,611,042 A | 3/1997 | Lordi |
| 5,930,167 A | 7/1999 | Lee |
| 6,732,221 B2 | 5/2004 | Ban |
| 8,111,548 B2 | 2/2012 | Mokhlesi |
| 8,886,877 B1* | 11/2014 | Avila ............... G06F 3/0679 711/103 |
| 8,902,647 B1* | 12/2014 | Raghu ............ G11C 16/3427 365/185.02 |
| 9,026,757 B2 | 5/2015 | Li |
| 2013/0128671 A1 | 5/2013 | Shin |
| 2013/0145234 A1* | 6/2013 | Yoon ............... G06F 11/1008 714/773 |
| 2013/0304966 A1* | 11/2013 | Joo ................. G06F 12/0246 711/103 |
| 2014/0157086 A1 | 6/2014 | Sharon |
| 2016/0098213 A1 | 4/2016 | Franceschini |
| 2016/0266821 A1 | 9/2016 | Sathyanarayan |
| 2017/0031612 A1 | 2/2017 | Ravimohan |
| 2017/0185329 A1* | 6/2017 | Park ................. G06F 3/0619 |

* cited by examiner

*Primary Examiner* — Tuan T Nguyen

(74) *Attorney, Agent, or Firm* — Vierra Magen Marcus LLP

(57) ABSTRACT

A memory system comprises a plurality of non-volatile memory cells grouped into blocks of memory cells and a control circuit in communication with the memory cells. The control circuit is configured to program original data to a first block of memory cells and backup the original data by programming a copy of the original data across multiple blocks of memory cells at a word line offset. After being used to store backups of original data, blocks are rotated to be used for storing original data.

19 Claims, 18 Drawing Sheets

Host 140

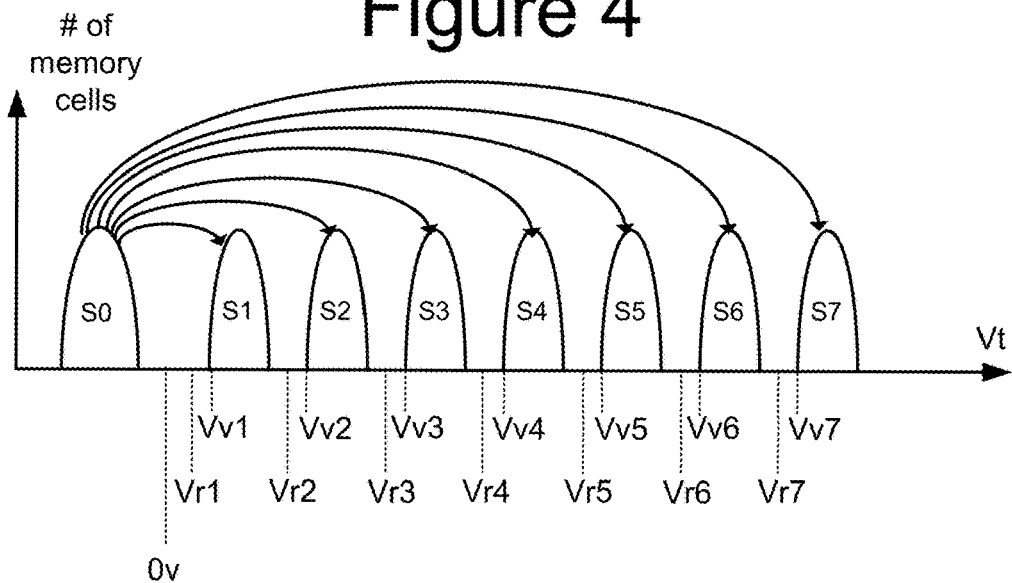
Figure 4
Figure 5
| S0 | S1 | S2 | S3 | S4 | S5 | S6 | S7 |
|----|----|----|----|----|----|----|----|
| 1  | 1  | 1  | 0  | 0  | 0  | 0  | 1  |
| 1  | 1  | 0  | 0  | 1  | 1  | 0  | 0  |
| 1  | 0  | 0  | 0  | 0  | 1  | 1  | 1  |
Figure 6C
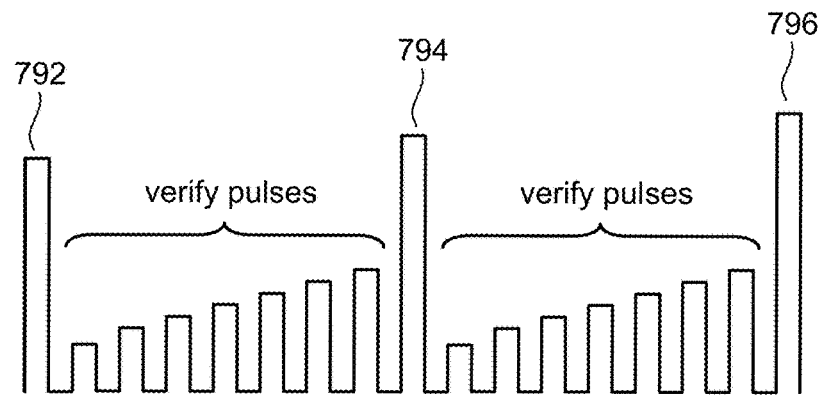

Figure 12A
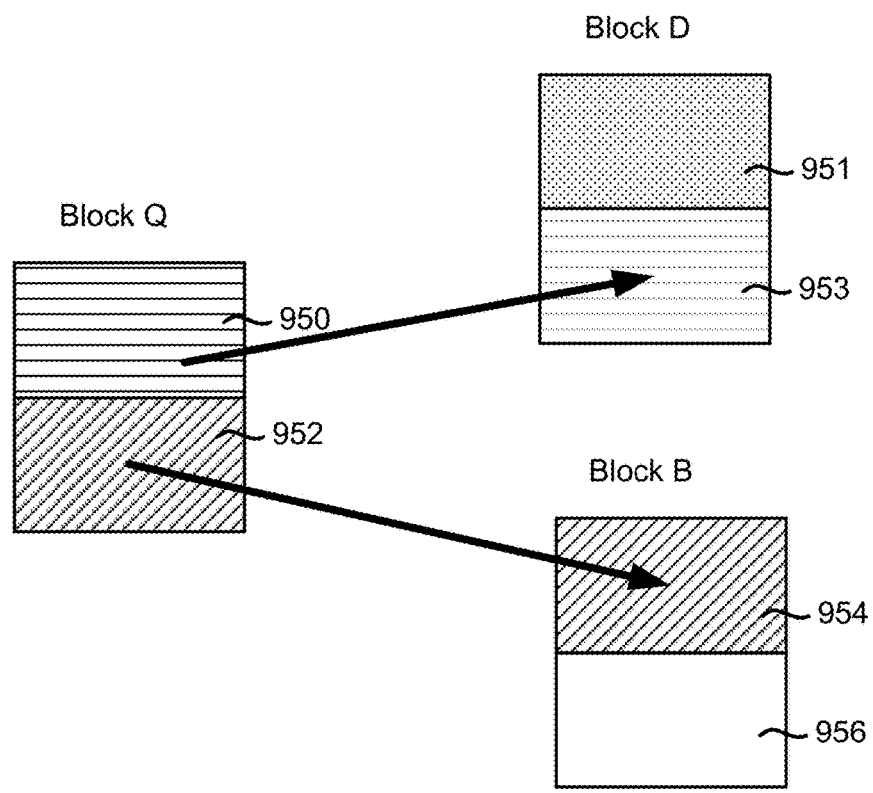
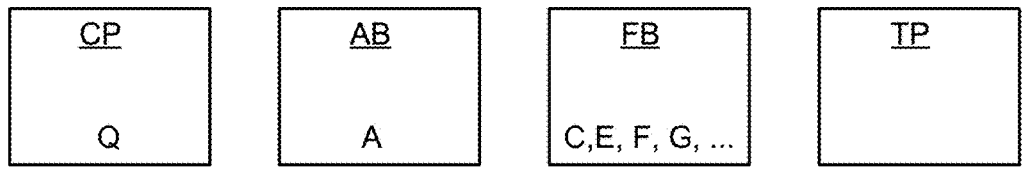

Figure 12B
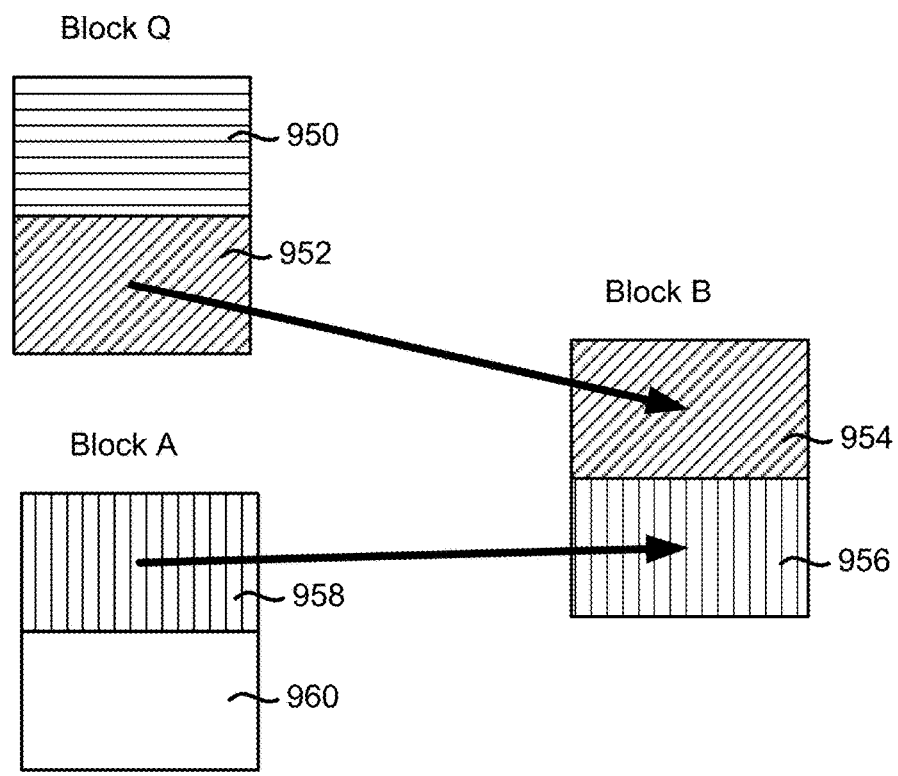
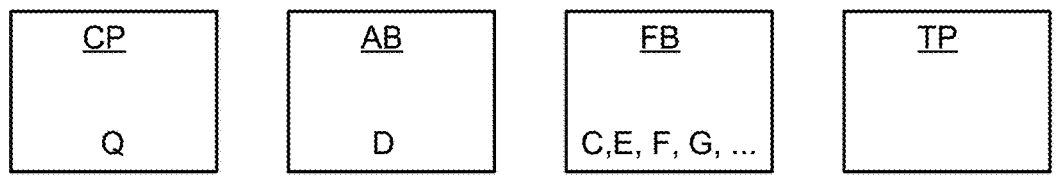

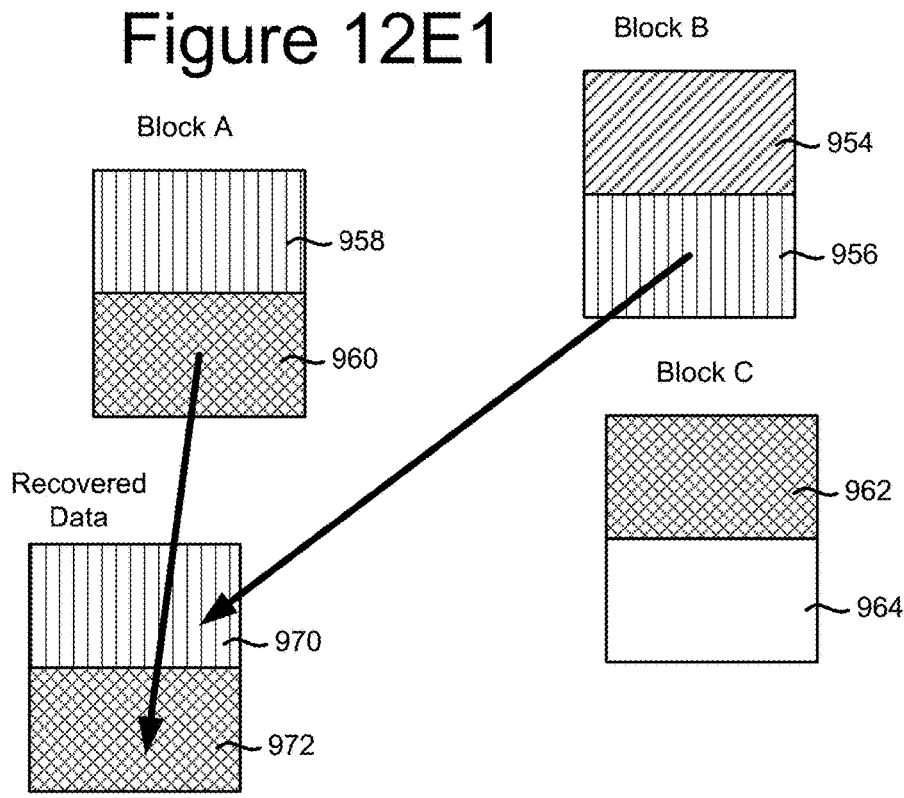
Figure 12E1
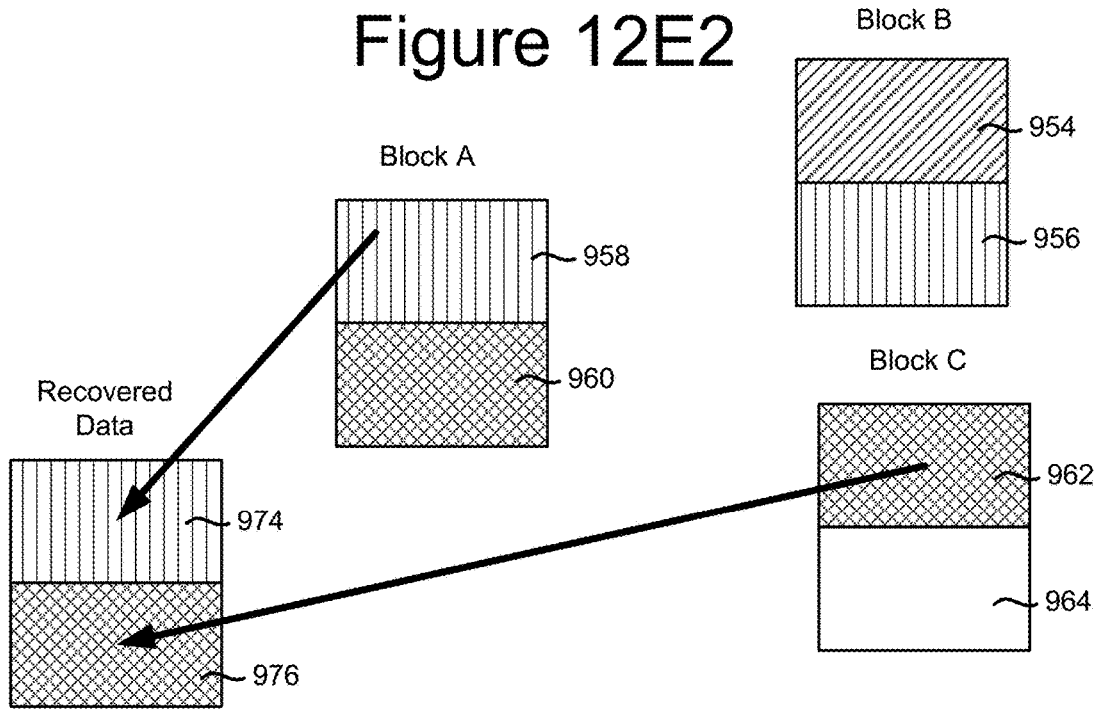
Figure 12E2

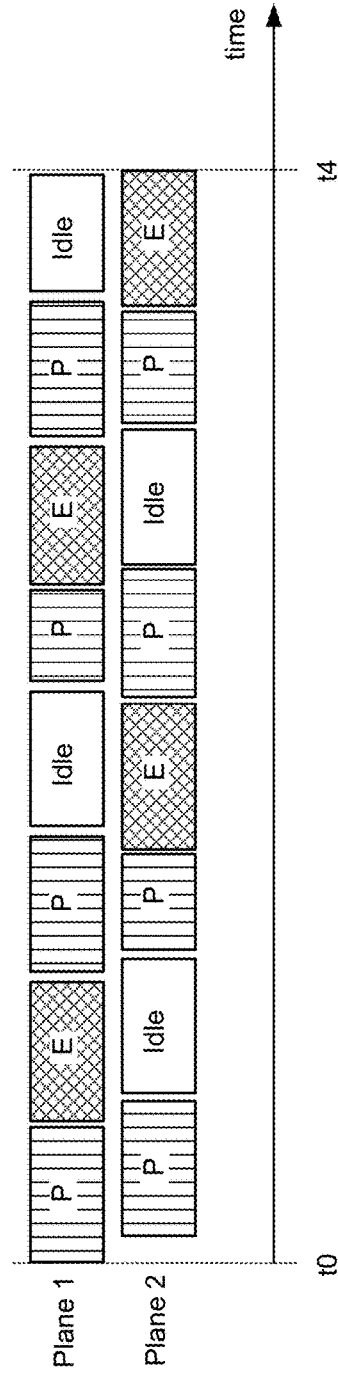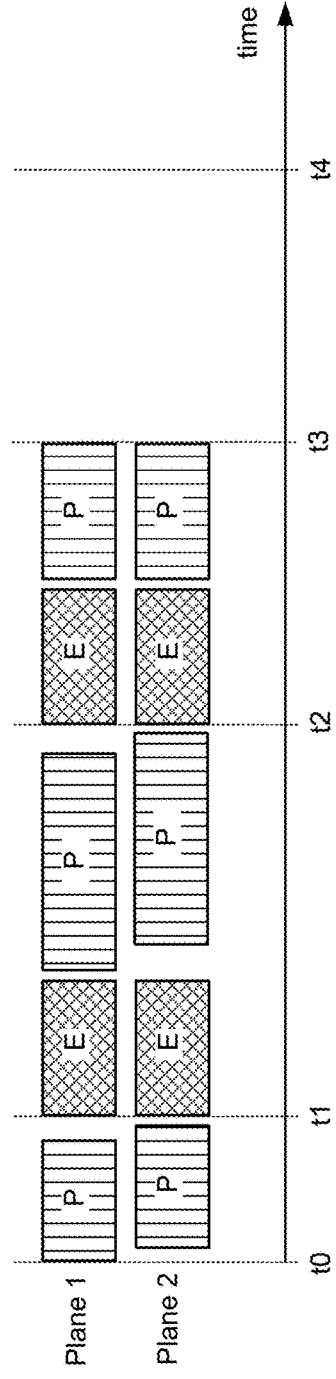

NON-VOLATILE MEMORY WITH BACKING UP OF PROGRAMMED DATA

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

Sometimes a memory system can have a physical defect which can cause an error when programming and/or reading the memory. For example, a first word line can be programmed correctly; however, when programming a neighboring word line both the first word line and the neighboring word line can become corrupted. In another example, a word line may appear to program correctly; however, the data is corrupted when trying to read it back.

BRIEF DESCRIPTION OF THE DRAWINGS

Like-numbered reference numbers in the drawings refer to common components in the different figures.

FIG. 4 depicts threshold voltage distributions.

FIG. 5 is a table describing one example of an assignment of data values to data states.

FIG. 6C depicts a word line voltage during programming and verify operations.

FIGS. 17A and 17B depicts timing of various programming and erasing operations.

DETAILED DESCRIPTION

A memory system is proposed that includes technology for protecting against some physical defects that corrupt programmed data. The memory system comprises a plurality of non-volatile memory cells grouped into blocks of memory cells and a control circuit in communication with the memory cells. The control circuit is configured to program original data to a first block of memory cells and backup the original data by programming a copy of the original data across multiple blocks of memory cells. In one example implementation, the copy of the original data is programmed across multiple blocks of memory cells at a word line offset.

After a block of original data has completed its programming (either initial programming or initial programming plus combining with additional data) the system confirms that the programming has completed successfully. If the data is confirmed to be programmed successfully (ie not corrupted), then the backups are released. If there is an error, then the data can be recovered from a combination of the block storing the original data and the blocks storing the backup copies.

In one embodiment, after being used to store backups of original data, blocks are rotated to be used for storing original data.

Figure 1:
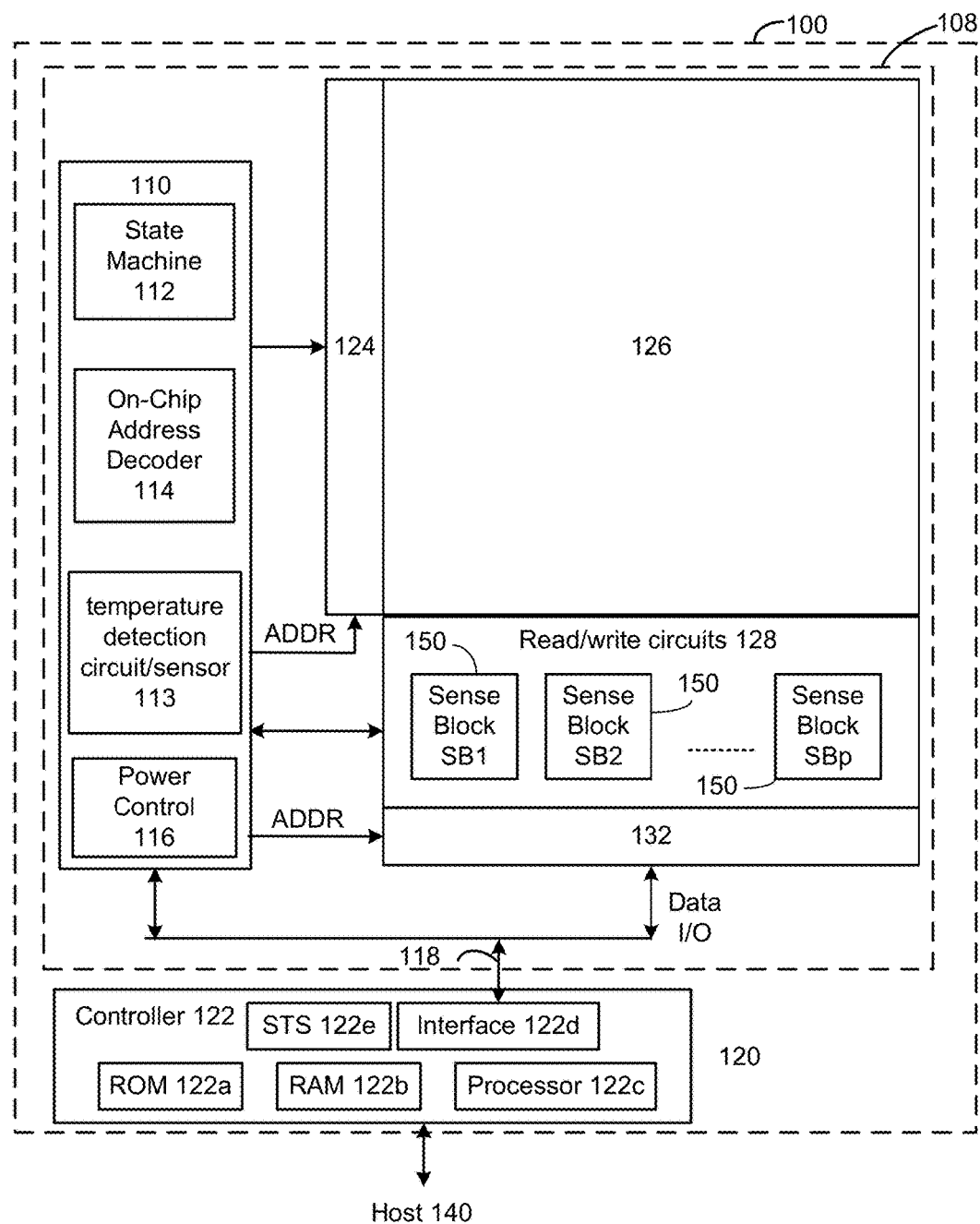
FIG. 1 is a block diagram depicting one embodiment of a memory system.
Figure 2:
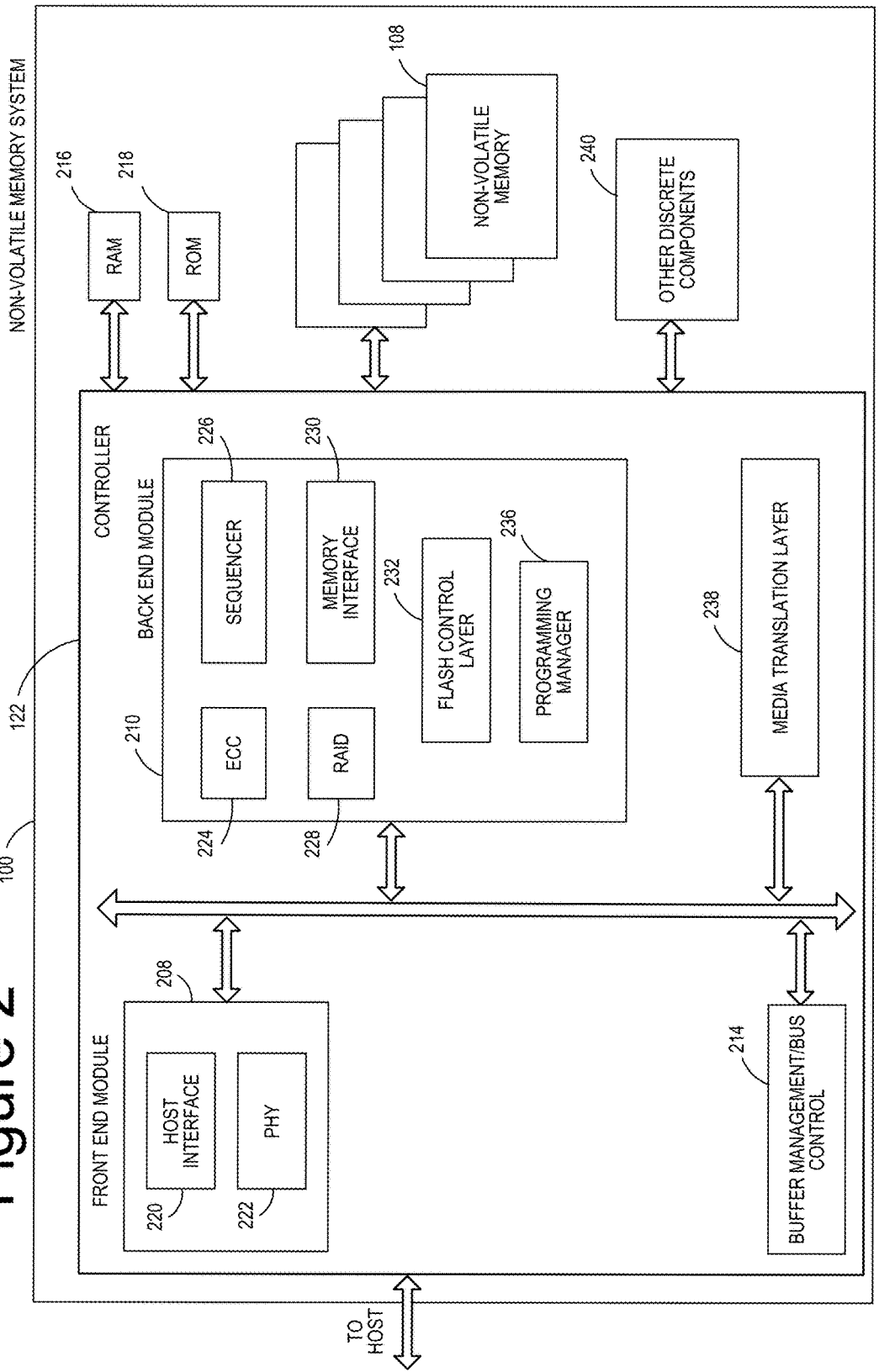
FIG. 2 is a block diagram depicting one embodiment of a memory system.

FIGS. 1 and 2 describe examples of memory systems that can be used to implement the technology proposed herein. FIG. 1 is a functional block diagram of an example memory device. The components depicted in FIG. 1 are electrical circuits. Memory device 100 includes one or more memory die 108. Each memory die 108 includes a memory structure 126 of memory cells (such as, for example, a three dimensional memory array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells (connected to the same word line) to be read or programmed in parallel. In some systems, a controller 122 is included in the same memory device 100 as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., erase, program, read, and others) on memory structure 126, and includes a state machine 112, an on-chip address decoder 114, a power control module 116 and a temperature detection circuit 116. State machine 112 provides die-level control of memory operations, such as programming different memory cells to different final targets for a common data state based on distance to an edge of a word line layer. In one embodiment, memory system will have state machine 112 implement the functions of controller 122, thereby eliminating the need for controller 122. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

Temperature detection circuit 113 (which is an example of a memory temperature sensor on memory die 108) is configured to detect temperature at the memory die 108, and can be any suitable temperature detection circuit known in the art. The on-chip address decoder 114 provides an address interface between addresses used by controller 122 to the hardware addresses used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers.

Either (1) controller 122 in combination with control circuitry 110, read/write circuits 128, and decoders 124 & 132; (2) state machine 112 in combination with decoders 114/124/132, temperature detection circuit 113, power control module 116, and read/write circuits 128; or (3) another circuit performing similar functions to either of the above can be referred to as a control circuit.

The (on-chip or off-chip) controller 122 (which in one embodiment is an electrical circuit) may comprise one or more processors 122c, ROM 122a, RAM 122b, and Memory Interface 122d, all of which are interconnected. One or more processors 122c is another example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described below. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. For example, memory interface 122d can change the format or timing of signals, provide a buffer, isolate from surges, latch I/O, etc. Processor 122c can issue commands to control circuitry 110 (or any other component of memory die 108) via Memory Interface 122d.

Memory structure 126 may comprise one or more arrays of memory cells including a three dimensional (3D) array of non-volatile memory cells. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate.

In one embodiment, memory structure 126 is a three dimensional memory structure that includes vertical NAND strings with charge-trapping material. Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. A NAND flash memory array may be configured so that the array is composed of multiple NAND strings of which a NAND string is composed of multiple memory cells sharing a single bit line and are accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays. A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array. One example of a suitable three dimensional memory array can be found in U.S. Pat. No. 9,721,662, incorporated herein by reference in its entirety. Other (2D and 3D) memory structures can also be used with the technology described herein. For example, floating gate memories (e.g., NAND-type and NOR-type flash memory), ReRAM cross-point memories, magnetoresistive memory (e.g., MRAM), and phase change memory (e.g., PCM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

FIG. 2 is a block diagram of example memory system 100, depicting more details of one embodiment of controller 122. As used herein, a flash memory controller (or controller) is a device that manages data stored on flash (or other type of) memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD) drive.

In some embodiments, non-volatile memory system 100 includes a single channel between controller 122 and non-volatile memory die 108; however, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a programming manager 236, which can be used to manage (in conjunction with the circuits on the memory die) the programming of memory cells. For example, in one embodiment, programming manager 236 may perform and/or manage the processes of FIGS. 6A, 11, 14 and 15, described below. Programming manager 236 can be an electrical circuit, a set of one or more software modules, or a combination of a circuit and software.

Additional components of system 100 illustrated in FIG. 2 include media translation layer 238, which performs logical to physical address translation and wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

In one embodiment, Media Translation Layer (MTL) 238 may be integrated as part of the flash management that may handle errors and interfacing with the host. In particular, MTL may be a module in flash management and may be responsible for the internals of NAND management. In particular, the MTL 238 may include an algorithm in the memory device firmware which translates writes from the host into writes to the flash memory 126 of die 108. The MTL 238 may be needed because: 1) the flash memory may have limited endurance; 2) the flash memory 126 may only be written in multiples of pages; and/or 3) the flash memory 126 may not be written unless it is erased as a block. The MTL 238 understands these potential limitations of the flash memory 126 which may not be visible to the host. Accordingly, the MTL 238 attempts to translate the writes from host into writes into the flash memory 126. As described below, erratic bits may be identified and recorded using the MTL 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to emulate a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
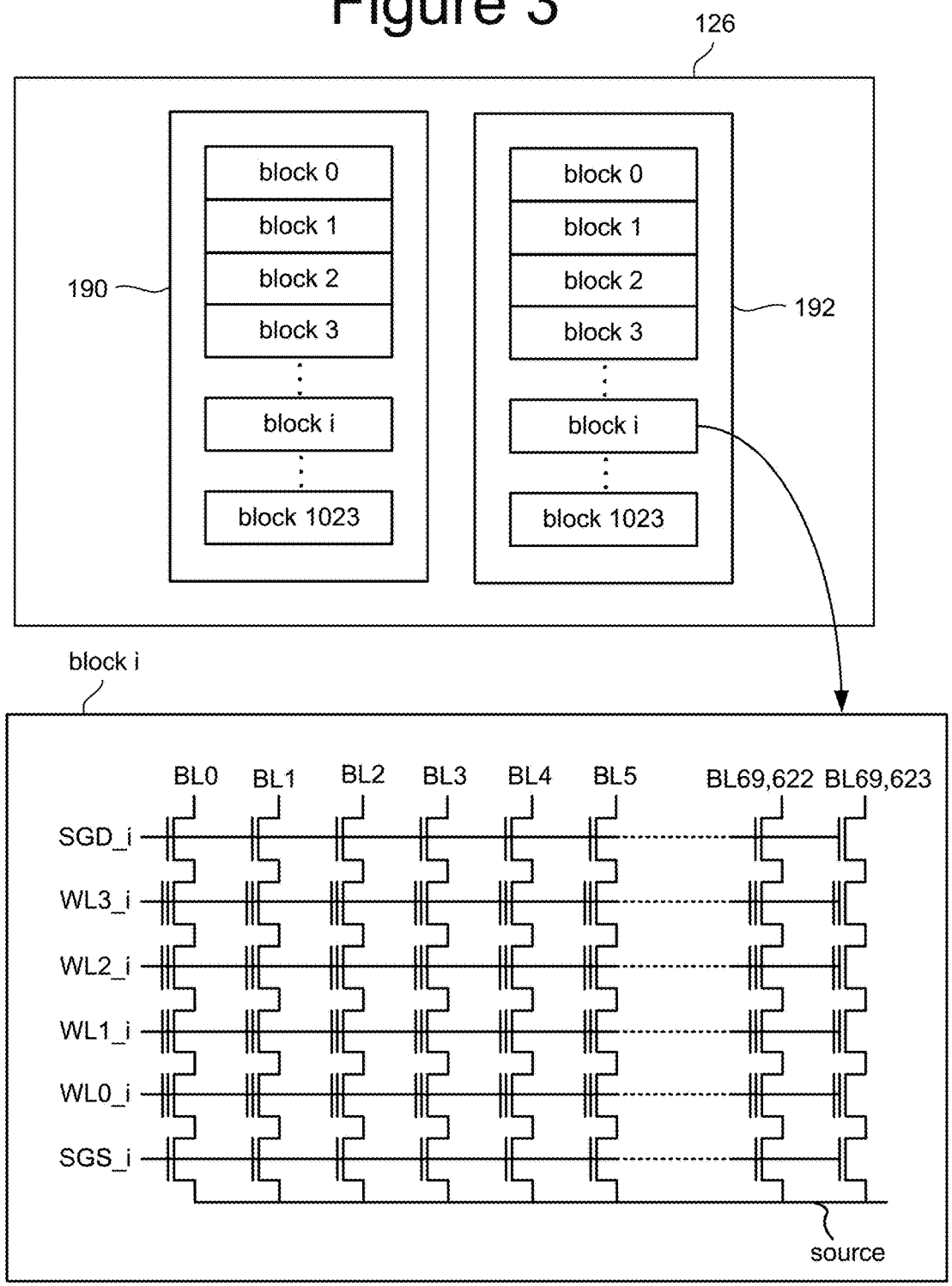
FIG. 3 is a block diagram of one embodiment of a memory structure.

FIG. 3 depicts an example of memory structure 126. In one embodiment, memory structure 126 is an array of memory cells is divided into multiple planes. In the example of FIG. 3, memory structure 126 is divided into two planes: Plane 190 and Plane 192. In other embodiments, more or less than two planes can be used.

In some embodiments, each plane is divided into a large number of blocks (e.g., blocks 0-1023, or another amount). Each block include many memory cells. In one embodiment, the block is the unit of erase and, therefore, is sometimes referred to as an erase block. That is, each block contains the minimum number of memory cells that are erased together. Other units of erase can also be used.

In one embodiment, a block contains a set of NAND stings which are accessed via bit lines (e.g., bit lines BL0-BL69,623) and word lines (WL0, WL1, WL2, WL3). FIG. 3 shows four memory cells connected in series to form a NAND string. Although four memory cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS). Although FIG. 3 shows 69624 bit lines, a different number of bit lines can also be used. Additionally, as discussed above, the block can implement non-volatile storage technologies other than NAND flash memory.

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. One example of a page can be all of the data stored in the memory cells connected to a common word line and in a common block. Another example of a page is a fraction (e.g., ¼, ½, ⅓) of the memory cells connected to a common word line and in a common block or a fraction of the bits stored in those memory cells. A page includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 4 illustrates example threshold voltage distributions for the memory cell array when each memory cell stores three bits of data. Other embodiments, however, may use other data capacities per memory cell (e.g., such as one, two, four, or five bits of data per memory cell). FIG. 4 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 4 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 4 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 4 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

FIG. 5 is a table describing one example of an assignment of data values to data states. In the table of FIG. 5, S0=111. S1=110, S2=200, S3=000, S4=010, S5=011, S6=001 and S7=101. Other encodings of data can also be used. No particular data encoding is required by the technology disclosed herein. In embodiment, when a block is subjected to an erase operation, all memory cells are moved to data state S0, the erased state. In the embodiment of FIG. 5, all bits stored in a memory cell are 1 when the memory cells is erased (e.g., in data state S0).

Figure 6A:
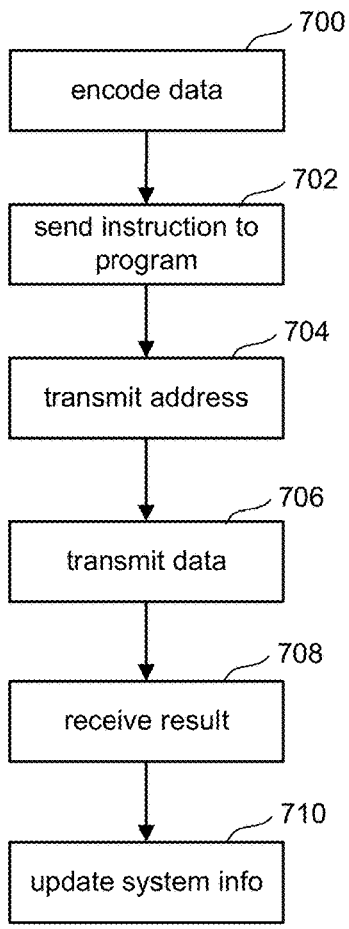
FIG. 6A is a flow chart describing one embodiment of a process for programming.

FIG. 6A is a flowchart describing one embodiment of a process for programming that is performed by controller 122. In some embodiments, rather than have a dedicated controller, the host can perform the functions of the controller. The process of FIG. 6A can be performed in response to receiving data, a logical address and a programming command from host 140 at controller 122. In that case, media translation layer 238 of controller 122 will translate the logical address to a physical address in the memory structure 126 of a memory die 108. In other embodiments, the process of FIG. 6A can be performed as part of a system operation at the direction of controller 122, such as during a defragmentation process.

Figure 6B:
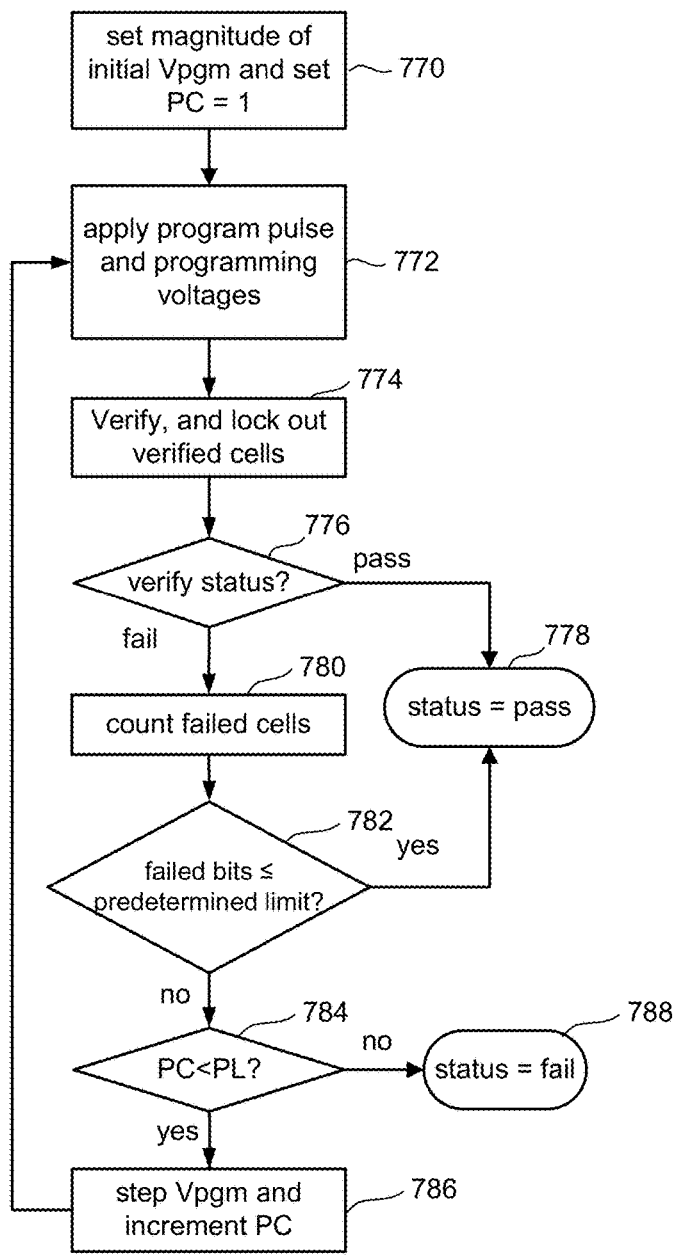
FIG. 6B is a flow chart describing one embodiment of a process for programming data into memory cells connected to a common word line.

In step 700 of FIG. 6A, the data to be programmed is encoded to include error correction information. For example, ECC engine 224 is used to create code words. In one embodiment, data is programmed in units of pages. So, for example, the process of FIG. 6B is used to program one page of data. Because it is possible that errors can occur when programming or reading, and errors can occur while storing data (e.g., due to electrons drifting, data retention issues or other phenomenon), error correction is used with the programming of a page of data.

Many error correction coding schemes are well known in the art. These conventional error correction codes (ECC) are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word. In other embodiments, the actual data is changed.

The particular parameters for a given error correction code include the type of code, the size of the block of actual data from which the code word is derived, and the overall length of the code word after encoding. For example, a typical BCH code applied to 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the Controller receives user or host data, also referred to as information bits, that is to be stored non-volatile three dimensional memory structure 126. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, Jan. 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in three dimensional memory structure 126 by programming one or more memory cells to one or more programming states, which corresponds to v.

In one possible implementation, an iterative probabilistic decoding process is used which implements error correction decoding corresponding to the encoding implemented in Controller 122. Further details regarding iterative probabilistic decoding can be found in the above-mentioned D. MacKay text. The iterative probabilistic decoding attempts to decode a code word by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

The LLR for a bit is given by $$Q = \log_2 \frac{P(v=0|Y)}{P(v=1|Y)},$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

Controller 122 receives the code word Y1 and the LLRs and iterates in successive iterations in which it determines if parity checks of the error encoding process have been satisfied. If all parity checks have been satisfied, the decoding process has converged and the code word has been error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

Looking back at FIG. 6A, in step 702 controller 122 sends instructions to one or more memory die 108 to program data. In step 704, controller 122 sends one or more addresses to one or more memory die 108. The one or more addresses indicate where to program the data. In step 706, controller 122 sends the data to be programmed to the one or more memory die 108. For example, the code words that are the result of the ECC process are transferred. In step 708, controller 122 receives a result of the programming from the one or more memory die 108. Example results include an indication that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

FIG. 6B is a flowchart describing one embodiment of a process for programming. The process of FIG. 6B is performed by the memory die 108 in response to the steps of FIG. 6A (i.e., in response to the instructions, data and addresses from controller 122). In one example embodiment, the process of FIG. 6B is performed on memory die 108 at the direction of state machine 112. The process of FIG. 6B can be used to implement the full sequence programming discussed above. Alternatively, the process of FIG. 6B can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 6B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage (see e.g. Vv1, Vv2, Vv3, Vv4, Vv5, Vv6, and Vv7 of FIG. 4). Memory cells that have been verified to reach their target are locked out from further iterations of the current programming process of FIG. 6B.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by ECC during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In another embodiment, the predetermined limit can be less than the number of bits that can be corrected by ECC during a read process to allow for future errors. Additionally, when programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 6B is performed.

In general, during verify operations (step 774) and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 4) or verify operation (e.g. see verify reference voltages Vv1, Vv2, Vv3, Vv4, Vv5, Vv6, and Vv7 of FIG. 4) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Step 772 of FIG. 6B includes applying a program voltage pulse on the selected word line. Step 774 of FIG. 6B includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. This is depicted in FIG. 6C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify reference voltages by applying the verify references voltages as verify pulses.

Figure 7:
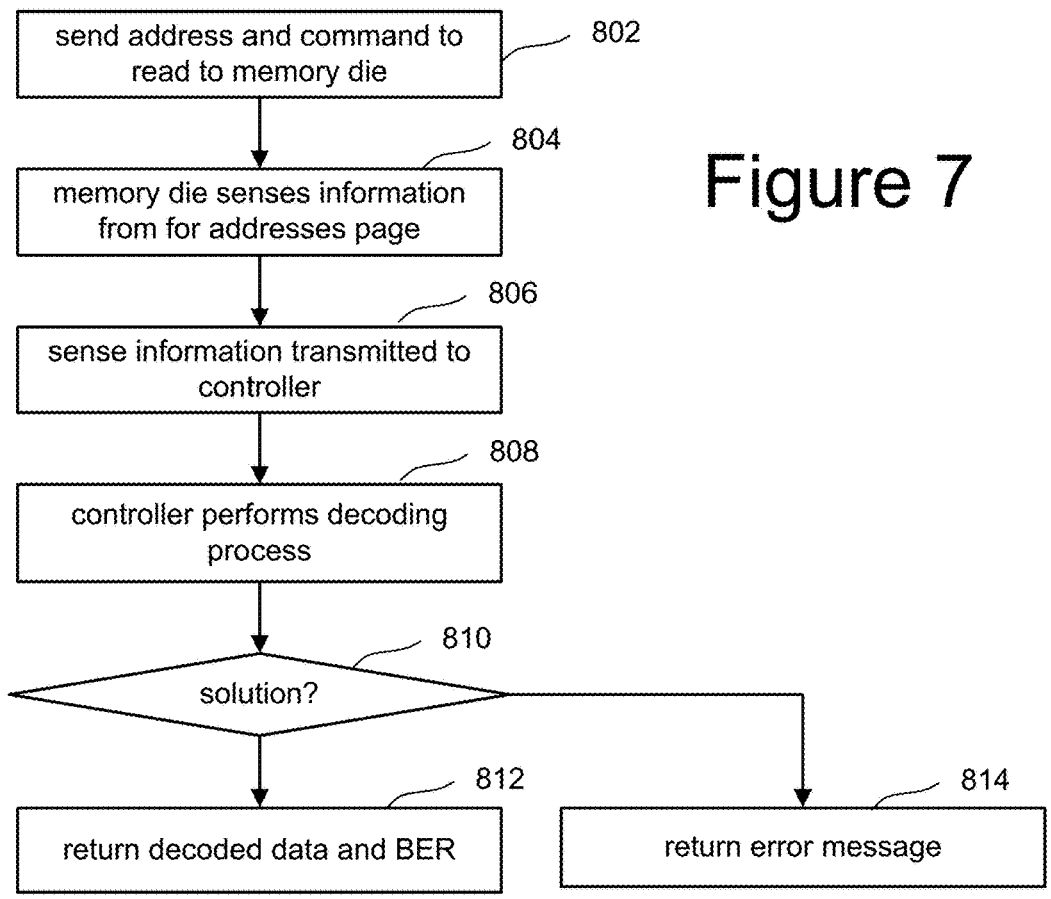
FIG. 7 is a flow chart describing one embodiment of a process for reading data from memory cells.

FIG. 7 is a flowchart describing on embodiment of a process for reading data stored in non-volatile memory (e.g., memory structure 126). The process of FIG. 7 can be performed in response to a command to read data from a host. The host can request that the memory system read data and provide a logical address for that data. Controller 122 will convert the logical address to a physical address in memory structure 126 (e.g. using media translation layer 238 of FIG. 2). The process of FIG. 7 can also be used to confirm the success of a programming process (e.g., that the data has not been corrupted). For example, after completing programming (even if the verification process for programming determines that the programming was performed successfully), the system can read back the data using a process of FIG. 7 to confirm that the data is stored properly in the non-volatile memory. It is possible, for example due to defects, that a programming process can complete successfully but the data will not be stored properly in the non-volatile memory. This situation can be discovered using the process of FIG. 7.

In step 802 of FIG. 7, controller 122 sends an address and a command to read data to memory die 108. In step 804, in response to the command, memory die 108 senses information from the addressed page. In one embodiment, the address sent from controller 122 to memory 108 is a page address. Step 804 includes sensing the data state for the memory cells at the addressed page. In some embodiments, the sensed information is used as part of a ECC decoding process to determine the final data values stored in the non-volatile memory. In step 806, the sensed information is transmitted from memory die 108 to controller 122. In step 808, controller 122 performs the ECC decoding process (see ECC engine 224)). The input of the decoding process is the information sensed in step 804. If the decoding process is successful, the output of the decoding process will be a data solution representing the data stored in the non-volatile memory. Additionally, the decoding process will identify how many errors were found in the data and that were corrected by the decoding process using error correction. The number of data bits that were in error and were corrected are referred to as the bit error rate (BER). Thus, if the decoding process successfully finds a solution (step 810), then controller 122 returns the decoded data and the BER in step 812. In one embodiment, the data is returned to host 140. In other embodiments, data can be used for another process within controller 122. BER is stored by controller 122 for analytics, logging, and/or used for predicting defects. If, in step 810, it is determined that the decoding process did not successfully find a correct solution, then in step 814 controller 122 returns an error message. The error message can be returned to host 140 or to another process in controller 122. As discussed above with respect to step 702, there are many different error correction processes that can be used with the technology described herein. Thus, the processes described herein, including the process of FIG. 7, are not limited to any one ECC technology.

As discussed above, sometimes a memory system can have a physical defect which can cause an error when programming and/or reading the memory. It has been observed that the first word line, and memory cells connected to the first word line, tend to suffer from more defects than other parts of the memory. Examples of such defects include shorts between word lines, a break in the word line, the word line being fabricated too thin, defects in the geometry of the memory cells, as well as other defects. In some instances, a defect at the first word line may have an effect on a neighboring word line. For example, a programming process may appear to have completed successfully for memory cells on the first word line. However, when programming the second word line, the memory cells connected to the first word line and the memory cells connected to the second word line become corrupted. Therefore, when the data on the first word line is read back, it is corrupted. There are also other instances when data appears to be programmed correctly but then appears to be corrupted when trying to read it back.

In some memory systems, data received from a host is stored in latches within the memory die for programming. After the memory die verifies that the data has been programmed correctly (see step 774 and 776 of FIG. 6B) the data is released from the latches. However, if the data appears to program correctly but then is determined to be corrupted when it is read back, then the data can be lost. One proposed solution for such a circumstance is to store a backup of the data in another location in the memory. However, this would mean that the capacity of the memory is reduced by 50% because all data would be stored in two locations.

Another solution that does not have as severe an impact on capacity is to program the data to two locations in the memory using the processes of FIG. 6B. After both processes have completed because the programming was verified, the controller will read back the data from one of the locations using the process of FIG. 7. If the data can be read back successfully (because it is not corrupted) then the system can release the second copy of the data.

Figure 8:
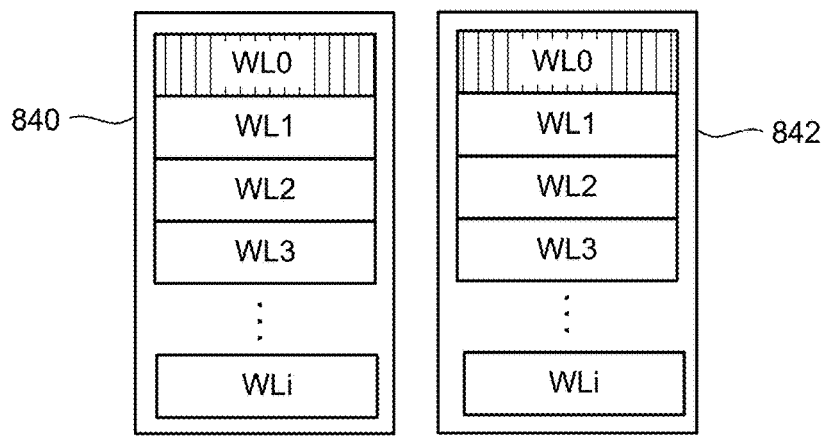
FIG. 8 is a block diagram depicting two blocks of a memory structure.
Figure 9:
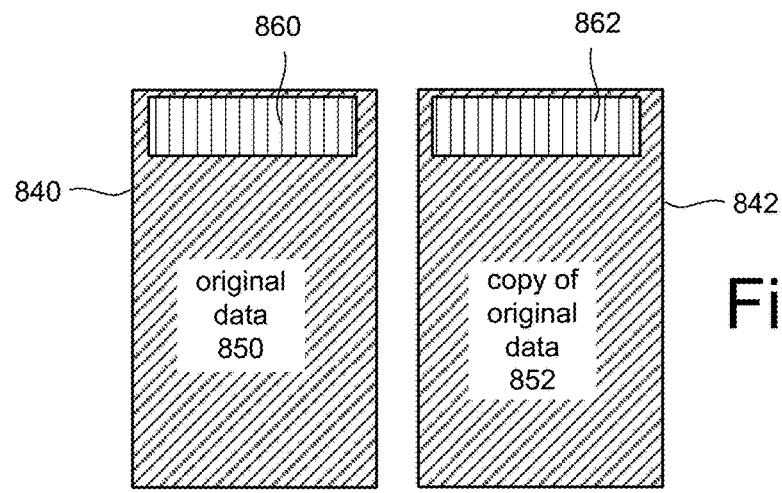
FIG. 9 is a block diagram depicting two blocks of a memory structure.

As discussed above, defects show up more often on the first word line WL0. In general, word line WL0 is the first word line of an erased block to be programmed. Thus, it is possible that if memory is temporarily backed up to a second location, both blocks can suffer from a defect at word line WL0. Therefore, even the above scenarios for backing up data will fail if both blocks have a defect at word line WL0. This is depicted graphically in FIG. 8, which shows block of memory cells 840 and block of memory cells 842. Both blocks include i+1 word lines (WL0, WL1, WL2, WL3, . . . WLi). Each of the rectangular boxes depicted in FIG. 8 which have a word line number in the center of the box (WL0, WL1, WL2, WL3, . . . WLi). represents the word line and the memory cells connected to that word line (sometimes referred to as a word line unit). Word line WL0 is shaded to indicate that there is one or more defects on word line WL0. The defect on word line WL0 can be a defect with the actual word line or a defect in the memory cells connected to that word line. Therefore if data is initially stored in block 840 and a copy is backed up to block 842, and both blocks suffer with defects at word line WL0 and both sets of data may (possibly) be corrupted in the same way causing the data stored on word line WL0 (for both blocks) to be lost. This is depicted in FIG. 9 which shows block 840 storing original data 850 and block 842 storing a copy of the original data 852. Data 860 of original data 850 stored on word line WL0 of block 840 is corrupted. Similarly, data 862 of copy 85, which is stored on word line WL0 block 842, is also corrupted.

To remedy this problem described above with respect to FIG. 9, it is proposed to program original data to a first block of memory cells (e.g. block 840) and program a copy (backup) of the original data across second and third blocks of memory cells such that a first portion of the copy of the data is programmed into the second block and a second portion of the copy of the data is programmed into the third block. This is depicted graphically in FIG. 10 which shows block 840 storing original data 850. Block 840, because it is storing the original data, is referred to as the primary block. A copy of original data 850 is backed up and stored across blocks 842 and 844 such that the first portion 852 of the copy of the data is stored in block 842 and the second portion 854 of the data is programmed into block 844. In this manner, if blocks 840 and 842 both have defects at word line WL0 (as depicted by 860 and 862), the data can still be recovered because the data in the copy in portion 852 that corresponds to the data that would be stored at location 860 of block 840 is now stored at location 864 of block 842, which is not at WL0. Therefore, data can be recovered by taking all the data from block 840 except for portion 860 and replacing that with portion 864 from block 842. If block 844 also had a defect at WL0, that portion of data could be read properly from the corresponding portions of data 850 in block 840. For example, the data stored in the memory cells connected to WL0 of block 844 may correspond to the data stored in the memory cells connected to WL32 of block 840, and if WL32 of block 840 is not defective, then the data would not be corrupted and there would be no need to access the backup in block 844. Because blocks 842 and 844 store the backups, they are referred to as secondary blocks.

Figure 10:
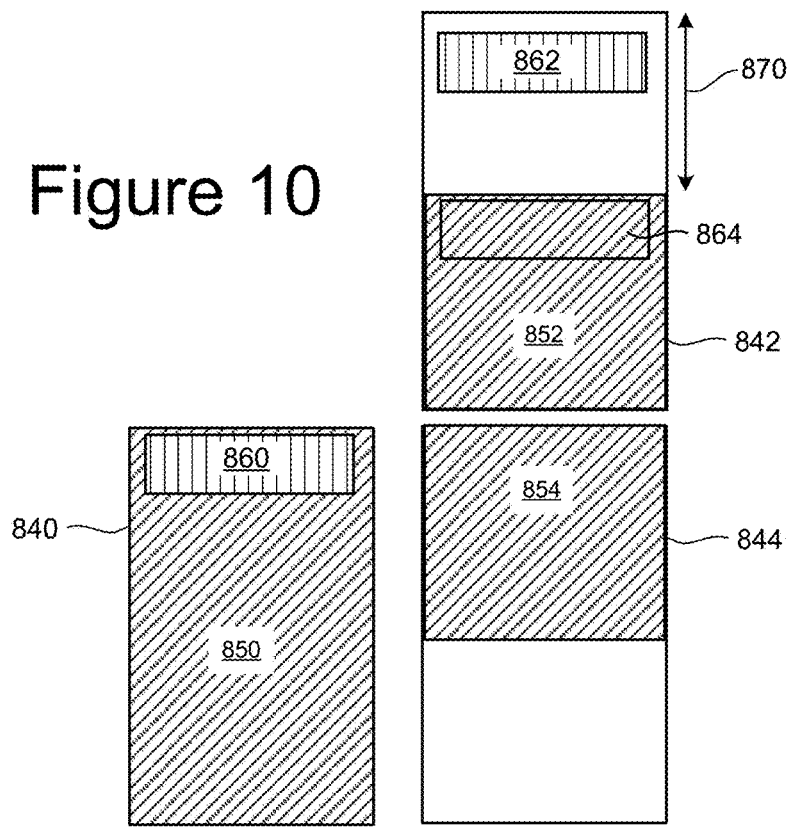
FIG. 10 is a block diagram depicting three blocks of a memory structure.

As can be seen from FIG. 10, the data (shaded) in the secondary blocks 842 and 844 is offset from the data (shaded) stored in block 840. For example, data 850 starts at word line WL0 (the first word line) of block 840, while data 852 in block 842 start at word line WLx. In some example implementations, each block will have 64 word lines and the portion of data 852 will start at word line 32. Therefore, the offset is 32 word lines. FIG. 10 shows arrow 870 indicating the offset (also referred to as a word line offset because the offset is by a number of word lines). In some embodiments, the control circuit is configured to program the copy of the data across blocks 842 and 844 such that half of the copy is in block 842 and half of the copy is in block 844. In such an embodiment, the offset will be half the total number of word lines in a block. In other embodiments, the offset can be different than half the number of word lines and the ratio of the share of backup data between blocks can be other than 50% at each of the two blocks. In one embodiment, the first portion of the copy of data 852 stored in block 842 is stored contiguously in block 842 and the second half of the copy of the data 854 is stored contiguously in block 844. By contiguously, it is meant that all the data is next to each other in a continuous manner without a break or gap in the data.

In one embodiment, data is programmed and read as a page of data. In one example implementation, all the data stored in memory cells connected to a single word line is a page of data. In other embodiments, a word line could store multiple pages of data (meaning that the memory cells connected to the word lines store multiple pages of data). Thus, data 850 and copies 852/854 are stored as pages of data. The control circuit is configured to program the copy of the data to blocks 842 and 844 such that the pages of the copy of the data in block 842 and the pages of the copy of the data in block 844 are at a word line offset in comparison to corresponding pages of data in block 840. For example, if the word line offset 870 is 32 word lines, then data from word line WL2 in block 840 will be stored in word line WL34 of block 842, and data from word line 50 of block 840 will be stored in word line 18 of block 844.

Figure 11:
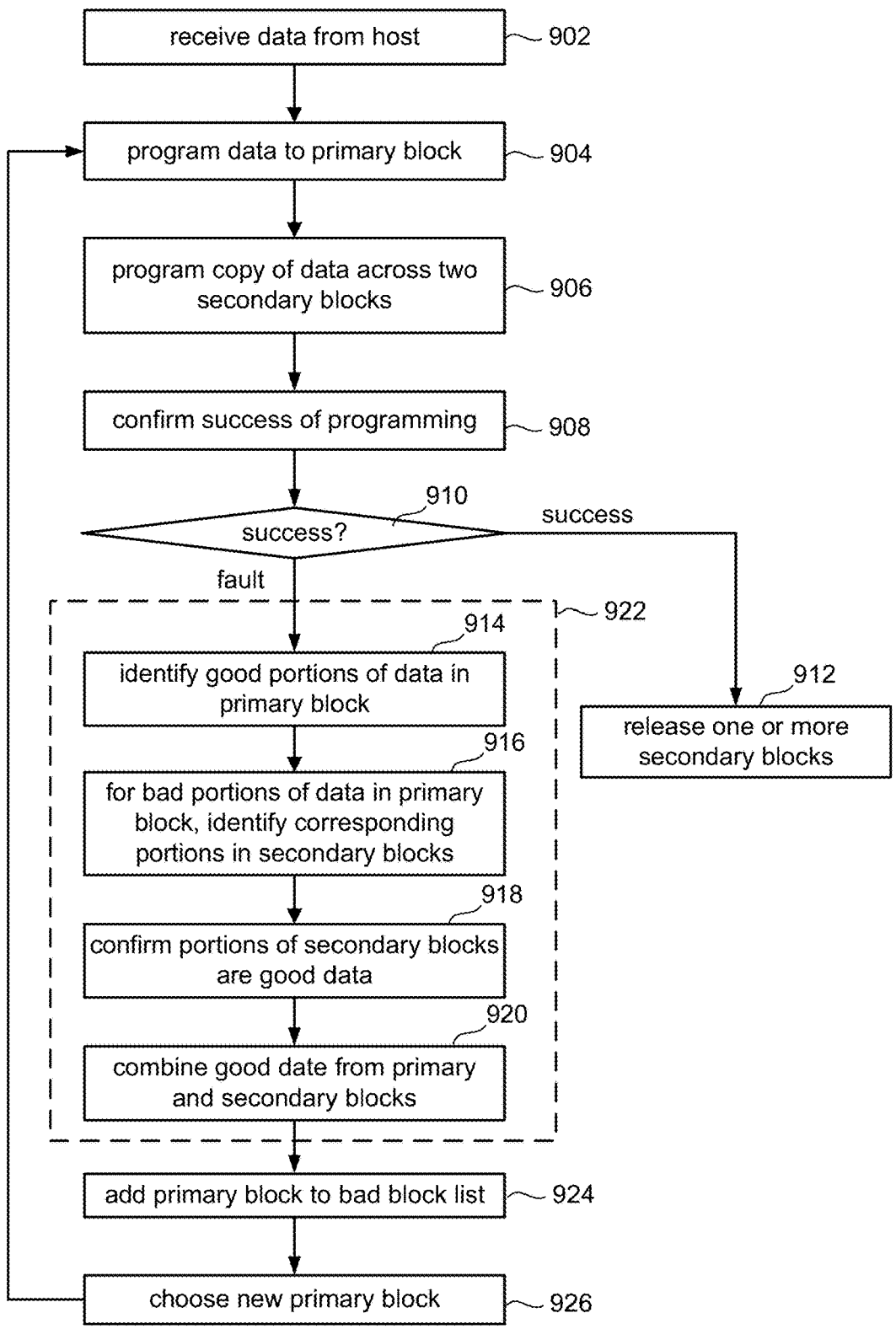
FIG. 11 is a flow chart describing one embodiment of a process for programming non-volatile storage.

FIG. 11 is a flowchart describing one embodiment of a process for programming performed by memory system 100. In one embodiment, the process of FIG. 11 is performed by a control circuit (see discussion above). In step 902, controller 122 receives data from host 140. In step 904, that data is programmed into the primary block (e.g. block 840 of FIG. 10). One embodiment of performing step 904 includes the controller 122 performing the process of FIG. 6A and memory die 108 performing the process of 6B. The process of FIG. 6b can be performed once for each page of data being programmed. In step 906, a copy of the data programmed in step 904 will be programmed across two secondary blocks (temporary backup). In one implementation of step 906, controller 122 will perform the process of FIG. 6A one or more times for each of the secondary blocks. Additionally, memory die 108 will perform the process of FIG. 6B for each page being programmed in each block (e.g., at the direction of state machine 112). The two secondary blocks can be in the same memory plane or in different memory planes. Additionally, the two secondary blocks can be in the same memory die or different memory dies. The secondary blocks can be in the same memory die and/or same plane as the primary block or in different plane and/or memory die 108. In one embodiment, steps 904 and 906 comprise the control circuit programming data to a first block of memory cells and programming a copy of the data across second and third blocks of memory cells such that a first portion of the copy of the data is programmed in the second block and a second portion of the copy of the data is programmed into the third block, as depicted in FIG. 10.

In step 908 of FIG. 11, controller 122 confirms the success of programming. As discussed above, the programming process includes verification (see steps 774 of FIG. 6b). Even if verification is successful in the programming process, there is still a possibility that the data could be corrupted. The process of confirming success of programming in step 908 includes reading back the data using a read process. For example, one example implementation of step 908 includes performing the process of FIG. 7, which results in a set of properly decoded data and a BER or an error message. In one embodiment, step 908 is performed after several pages of data have been performed. If, in step 908, the data is read back successfully (step 910), then in step 912 controller 122 releases one or more of the secondary blocks. That is, those blocks are no longer needed to store a copy (backup) of the data programmed in step 906. If the result of confirming the successful programming is a fault in step 910 (e.g., because the process of FIG. 7 returned an error message), then in step 922 the controller recovers the data. In one example, the controller is configured to recover a subset of the data from the primary block and second subset of the data from one of the two secondary blocks. In another embodiment, controller can recover the data from only the secondary blocks. In another embodiment, the controller will recover the data by taking portions from the primary block and from both secondary blocks. After recovering the data, in step 924, the controller adds the primary block to a list of bad blocks so that primary block is not used again. In step 926, controller 122 chooses a new primary block for programming the data and the process will loop back to step 904 to attempt to program that data again.

In one embodiment, the process of recovering the data, step 922 of FIG. 11, includes identifying good portions of the data in the primary block (step 914). For bad portions of the data in the primary block, (e.g. due to corrupted data because of a defect in the physical structure), controller 122 identifies corresponding portions in the secondary blocks in step 916. For example, bad portion 860 of block 840 of FIG. 10 corresponds to portion 864 of block 842. In step 918, controller 122 confirms that the corresponding portions of the secondary blocks are good (uncorrupted) data. In step 920, controller 122 combines the good data from the primary block and the good data from the one or more secondary blocks. Other variations for recovering data can also be used.

The above discussion of FIG. 11 describes a division of duty between controller 122 and memory die 108. The processes performed on memory die 108 are performed at the control of state machine 112. In other embodiments, the entire process of FIG. 11 can be performed on memory die 108, with state machine 112 performing all the control circuit functions. That is, state machine 112 will perform the functions described above to be the responsibility of controller 108.

FIGS. 12A-12E2 depict sets of blocks in various stages of the process of FIG. 11. For example, FIG. 12A shows block B, block D and block Q prior to the performance of FIG. 11 for new data. That is, the process of FIG. 11 can be performed multiple times, such as every time data is received from the host. FIG. 12A shows the state of these three blocks prior to new data (destined for block A) being received from the host. That prior received data is stored in block Q. In this example, the word line offset for copies of data is 50% of the total number of word lines. Therefore, each block is divided into two equal sections. Block Q has section 950 and section 952. In the embodiment with 64 word lines, section 950 corresponds to word lines WL0-WL31 and section 952 corresponds to word lines WL32-WL63. Block Q is a primary block for storing original data. Blocks B and D are secondary blocks for storing copies of that data (i.e. backups). The original data stored in block Q is backed up and stored across blocks B and D such that the data stored in section 950 of block Q is copied into section 950 of block D and the data stored in section 952 of block Q is copied into section 954 of block B (as evidenced by the common shading). Section 951 of block D is storing earlier data from another block. Section 956 of block B is not storing any data at this time.

FIG. 12A also shows four lists maintained by controller 122: CP, AB, FB, and TP. CP refers to the closed pool of blocks, which are blocks which have been fully programmed and are now closed from anymore programming. In one embodiment, once a block is fully closed, it is possible to release or erase the copies of data for that block. AB are the allocated blocks, which represent blocks that are currently free but allocated to be used as primary blocks for storing future original data received from the host. FB is a list of free blocks that may be used as secondary blocks to store copies of data. TP represents the temporary pool, which stores a list of blocks that are secondary blocks that have been filled up and are ready to be released and erased. The four lists can be stored in any form or data structure that is appropriate on controller 122 (e.g. in RAM 216 of FIG. 3). FIG. 12A shows block Q in the closed pool CP, block A in the list of allocated blocks AB, no blocks in the temporary pool TP and blocks C, E, F, G, . . . in the free pool FB.

FIG. 12B shows the state of the blocks midway through step 906 after data has been received that is destined for block A. As discussed above, step 906 includes programming a copy of the data across two secondary blocks. FIG. 12B shows the data being programmed into one of those two secondary blocks. In one embodiment, the data is programmed across the two blocks serially meaning that first one of the blocks is programmed and then the second blocks are programmed. In another embodiment, the two secondary blocks can be programmed concurrently.

In some embodiments, step 906 of FIG. 11 is performed subsequent to performing step 940. In another embodiment, steps 904 and 906 can be performed concurrently such that the primary block and the two secondary blocks are programmed concurrently. FIG. 12B shows the new data (received in step 902 and programmed into primary block A in step 904). In this embodiment, only the first half of the new data has been programmed into primary block A, and it represents the data stored in section 948 of block A. The data stored in section 958 of block A has been copied and programmed into section 956 of block B. In one embodiment, section 958 of block A represents word lines WL0-WL31 and section 956 of block B represents word lines WL32-WL63. FIG. 12B shows an arrow from section 958 to section 956 to indicate that the data of section 958 of block A is copied or backed up into section 956 of block B. An additional arrow shows that the data stored in section 952 of block Q is backed up into section 954 of block B. At this point in time, section 960 of block A has not been programmed. Note that closed pool CP includes block Q. The allocated blocks list AB includes block D. The free blocks list FB include block C, E, F, G, . . . . There are no blocks currently in the temp pool TP. However, block B is about to be added to the temporary pool TP because block B is filled up. Note that FIG. 12B shows an embodiment where steps 904 and 906 are performed concurrently. Additionally, FIG. 12B shows a point in time halfway through the performance of those two steps.

Figure 12C:
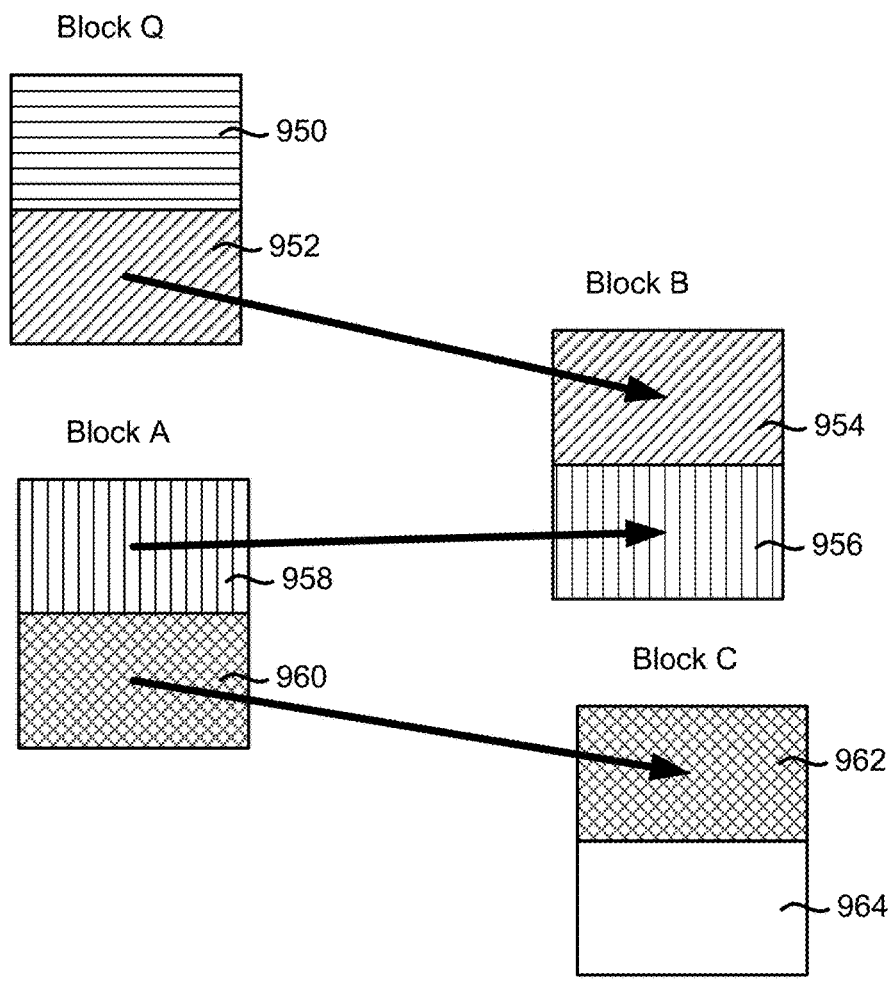
FIGS. 12A-E2 are block diagrams depicting blocks and data structures (e.g., lists) used by the controller during the process of FIG. 11.

FIG. 12C shows the blocks at the conclusion of steps 904 and 906 of FIG. 11. At this point in time, block A has completely been programmed, as depicted by the shaded regions representing data stored in sections 958 and 960 of block A. Thus, block A has been added to the closed pool CP. The data written to section 960 of block A (e.g. word lines WL32-WL63) has been copied into section 962 of block C (e.g. word lines WL0-WL31), as evidenced by the common shading. At this point in time, block B is in the temporary pool TP. As can be seen from FIG. 12C, the data of block A has been copied across blocks B and C such that the copy of the data in blocks B and C is immediately adjacent to a copy of other data with no intervening pseudo data between the copies. For example a copy of data from block A is immediately adjacent the copy of data from block Q, such that there is no intervening pseudo data in block B between the copies from block Q and block A. In this example, the first half 954 of block B stores data copied from block Q and the second half 956 of block B stores data copies from block A, such that there is no data store between. Pseudo data is fake data (data not received from a host) that can be used to force an offset.

As seen from this example of FIG. 12C, the first half of the copy of data from block A is stored in the second half of block B and the second half of the copy of data from block A is stored in the first half of block C. In other embodiments, the divisions between the secondary blocks can be something other than 50%. FIGS. 12A and 12C together show that over time the control circuit (e.g. the controller and/or state machine) programs one set of data into block Q and another set of data into block A. A copy of the data programmed into block Q is programmed across blocks D and B. A copy of the data programmed into block A is programmed across blocks B and C. The control circuit is configured to release and erase block B (which stores some of the copy data from block Q and some of the copy data from block A) in response to confirming successful programming (see steps 908 and 910) of the data in block Q and block A.

Figure 12D:
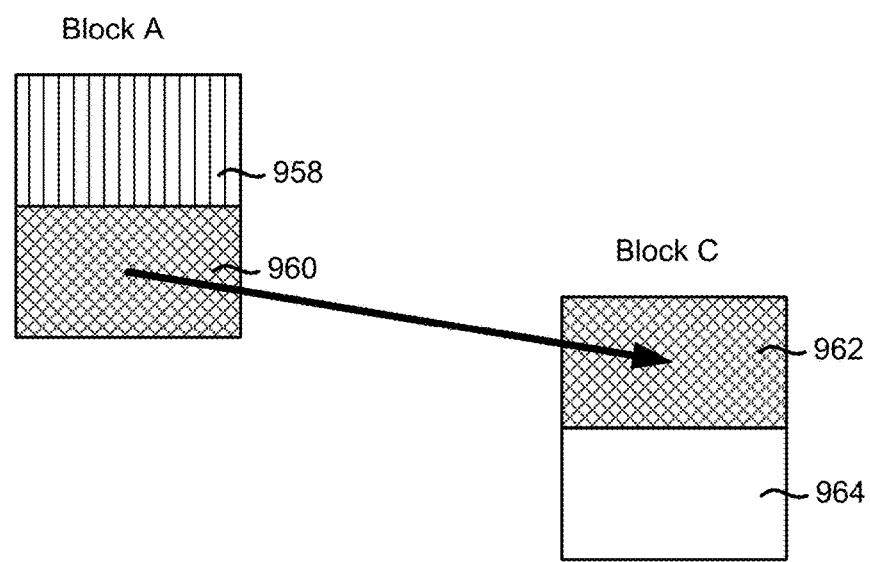

FIG. 12D shows the state of the blocks after performing step 912 of FIG. 11. As can be seen, block A has been completely programmed and is in the closed pool CP. Block B was released and erased, and is now in the allocated block list AB so that it can store new original data received from the host. That is, block B is now being exchanged from being a secondary block to being a primary block. New data received form the host that is to be stored in block B will be temporarily backed up by copying that data across two other blocks of memory cells from the list of free blocks FB.

FIGS. 12E1 and 12E2 depict examples of performance of recovering data (step 922 of FIG. 11). In the example of FIG. 12E1, recovering data comprises a first portion 970 recovered from section 956 of block B and a section portion 972 recovered from section 960 of block A. In the example of FIG. 12E2, the recovered data includes a first portion 974 recovered from section 958 of block A and a second portion 976 recovered from section 962 of block C. Other configurations can also be used.

In one embodiment, the control circuit is configured to program first data to a first block of memory cells as one bit per memory cell and store copies of that first data cross two secondary blocks of memory cells. The control circuit is further configured to program additional data to additional blocks of memory cells as one bit per memory cell and program copies of the additional data to other secondary blocks of memory cells. The control circuit is further configured to combine the first data from the first block of memory cells with the additional data from the additional blocks of memory cells as multiple bits per memory cell, and store that combined data as multiple bits per memory cell in a target block of memory cells. For example, data is first stored in three separate primary blocks as SLC data (one bit per memory cell), and then that data is eventually folded together into one block of memory cells storing three bits per memory bits (MLC data), as depicted in FIGS. 4 and 5. Such an arrangement is described by the flow chart of FIG. 13 which shows another example for programming data. In one embodiment, the process of FIG. 13 is performed by a control circuit (see discussion above).

Figure 13:
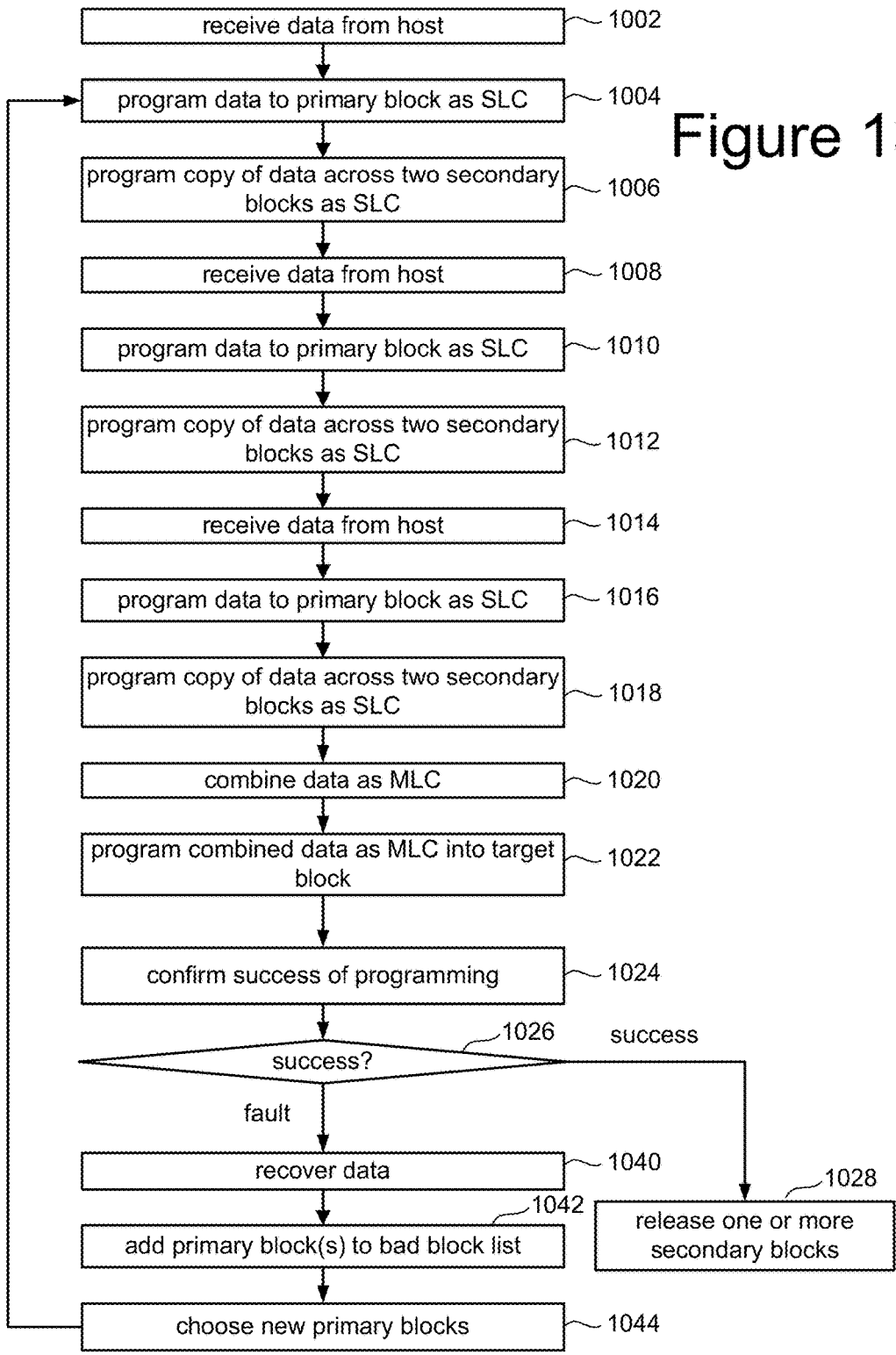
FIG. 13 is a flow chart describing one embodiment of a process for programming non-volatile storage.

In step 1002 of FIG. 13, controller 122 receives data from host 140. In step 1004, controller 122 causes that data to be programmed to a primary block as SLC data (one bit per memory cell). In step 1006, controller 122 will cause a copy of that data to be programmed across two secondary blocks of the memory die as SLC data (one bit per memory cell). In one embodiment, steps 1004, 1006 are similar to steps 904 and 906.

In step 1008, controller 122 receives data from host 140. In step 1008, controller 122 causes that data to be programmed to primary block as SLC data. In step 1012, a copy of that data is programmed across two secondary blocks as SLC data. In one embodiment, steps 1010 and 1012 are similar to steps 904 and 906. In step 1014, controller 122 receives data from host 140. In step 1016, controller 122 causes that data to be programmed to a primary block as SLC data. In step 1018, controller 122 causes a copy of that data to be programmed across two secondary blocks as SLC data. In one embodiment, steps 1016 and 1018 are similar to steps 904 and 906. At this point, three blocks of one bit per memory cell data is stored in the memory and copied for backups. In step 1020, the data from the three blocks is combined as MLC data. Because three blocks have been combined into one, one example includes storing the data as three bits per memory cell data. For example, FIG. 4 shows data states for three bits per memory cell data and FIG. 5 shows example data values for three bits per memory cell data. In one embodiment, all bits of data in the memory cell are in the same page of data. In another embodiment, each bit within a memory cell is in a different page. In one example implementation of step 1020, controller 122 reads the three pages from the three primary blocks (using the circuit of the memory die described above with respect to FIG. 1) and combines the data. In step 1022, controller 122 programs the combined data into a single block (the target block) as MLC data (e.g. three bits per memory cell) using the circuit of the memory die described above with respect to FIG. 1. Although the above example uses three bits per memory cell, other embodiment can use two bits per memory cell or more than three bits per memory cell.

At step 1024 of FIG. 13, controller 122 confirms the success of programming. In one example embodiment, step 1024 includes performing the process of FIG. 7 for all or a portion of the target block programmed in step 1022. If the confirmation process is successful (step 1026), then in step 1028 one or more of the secondary blocks will be released. For example, they can be erased and then put into a list of allocated blocks AB to be used as a primary block in the figure. If the process of confirming success at step 1024 was not successful (step 1026), then step 1040, controller 122 recovers the data (e.g., from portions of the target block or the three primary blocks, and portions of the secondary blocks programmed of steps 1006, 1012 and 1018). In step 1042, the three primary blocks and the target block will then be added to the bad block list. In other embodiments, the system can figure out which of the three primary blocks are corrupted and only put the corrupted blocks on the bad block list. In step 1044, new primary blocks are chosen to store the data and the process moves back to step 1004 to attempt to reprogram the data.

The above discussion of FIG. 13 describes a division of duty between controller 122 and memory die 108. The processes performed on memory die 108 are performed at the control of state machine 112. In other embodiments, the entire process of FIG. 11 can be performed on memory die 108, with state machine 112 performing all the control circuit functions. That is, state machine 112 will perform the functions described above to be the responsibility of controller 108.

Figure 14:
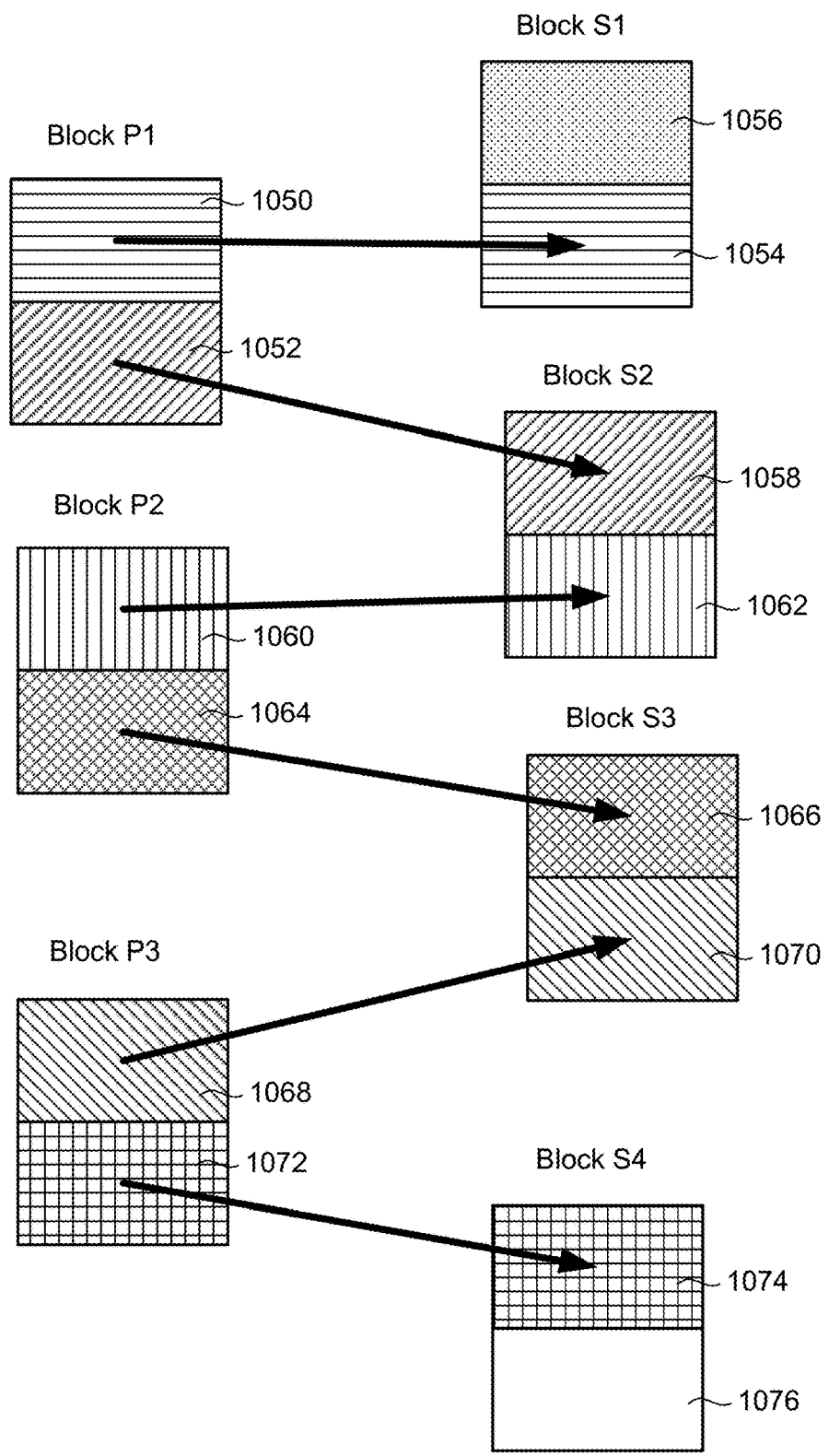
FIG. 14 is a block diagram depicting blocks during the process of FIG. 13.

FIG. 14 shows an example set of blocks at the conclusion of step 1018 of FIG. 13. FIG. 14 shows three primary blocks P1, P2 and P3. FIG. 14 also shows four secondary blocks S1, S2, S3 and S4. In the example embodiment of FIG. 14, half of the data in each primary block is stored in separate secondary blocks (as evidenced by the common shading). For example, the data stored in section 1050 of block P1 is stored in section 1054 of block S1. Section 1056 of block S1 stores previously received data. Data stored in section 1052 of block P1 is copied and stored in section 1058 of block S2. Data stored in section 1060 of block P2 is copied and stored in section 1062 of block S2. Data stored in section 1064 of block P2 is copied and stored in section 1066 of block S3. Data stored in section 1068 of block P3 is copied and stored in section 1070 of block S3. Data stored in section 1072 of block P3 is copied and stored in section 1074 of block S4. Section 1076 of block S4 has not been programmed yet. Thus, FIG. 14 shows three primary blocks P1, P2 and P3 programmed with three sets of SLC data. Each block of SLC data is copied and stored across two secondary blocks. In example of FIG. 14, half of the copy data is in the first block and the other half of the data is in the second block. In other examples, the split between secondary blocks can be different than 50% each. As can be seen from FIG. 14, a copy of data from one primary block is immediately adjacent a copy of data from another primary block. For example, second portion of copy data from P1 is immediately adjacent the first portion of data from P2 as evidenced by sections 1058 and 1062 being immediately adjacent to each other. Furthermore, in this example, each of the copies are at a word line offset equal to half the number of total number of word lines. That is, for any given page of data in the copy stored in the secondary block, the corresponding page of data in the primary block is at a word line offset equal to half the total number of word lines. Other magnitudes of offsets can also be used.

As discussed above with respect to FIGS. 12A-12E, after secondary blocks are filled, they are put into a temporary pool TP, and then subsequently released, erased and added to an allocation block list AB to be used a primary block. This exchange of blocks from secondary blocks to primary blocks helps more evenly distribute program-erase cycles among the blocks so that one small set of blocks does not get erased too often and wear out sooner.

In one embodiment, the memory cells form multiple planes, with each plane including multiple blocks of memory cells. In these embodiments with multiple planes, the control circuit is configured to concurrently erase blocks of memory cells from different planes that are storing copies of data all of which has been confirmed to have been programmed successfully into respective primary (target) blocks. That is, the process of FIG. 11 or the process of FIG. 13 can be performed separately on different planes; however, when it comes to erasing blocks that are in the temporary pool TP the erasing of blocks in different planes will be performed at the same time.

Figure 15:
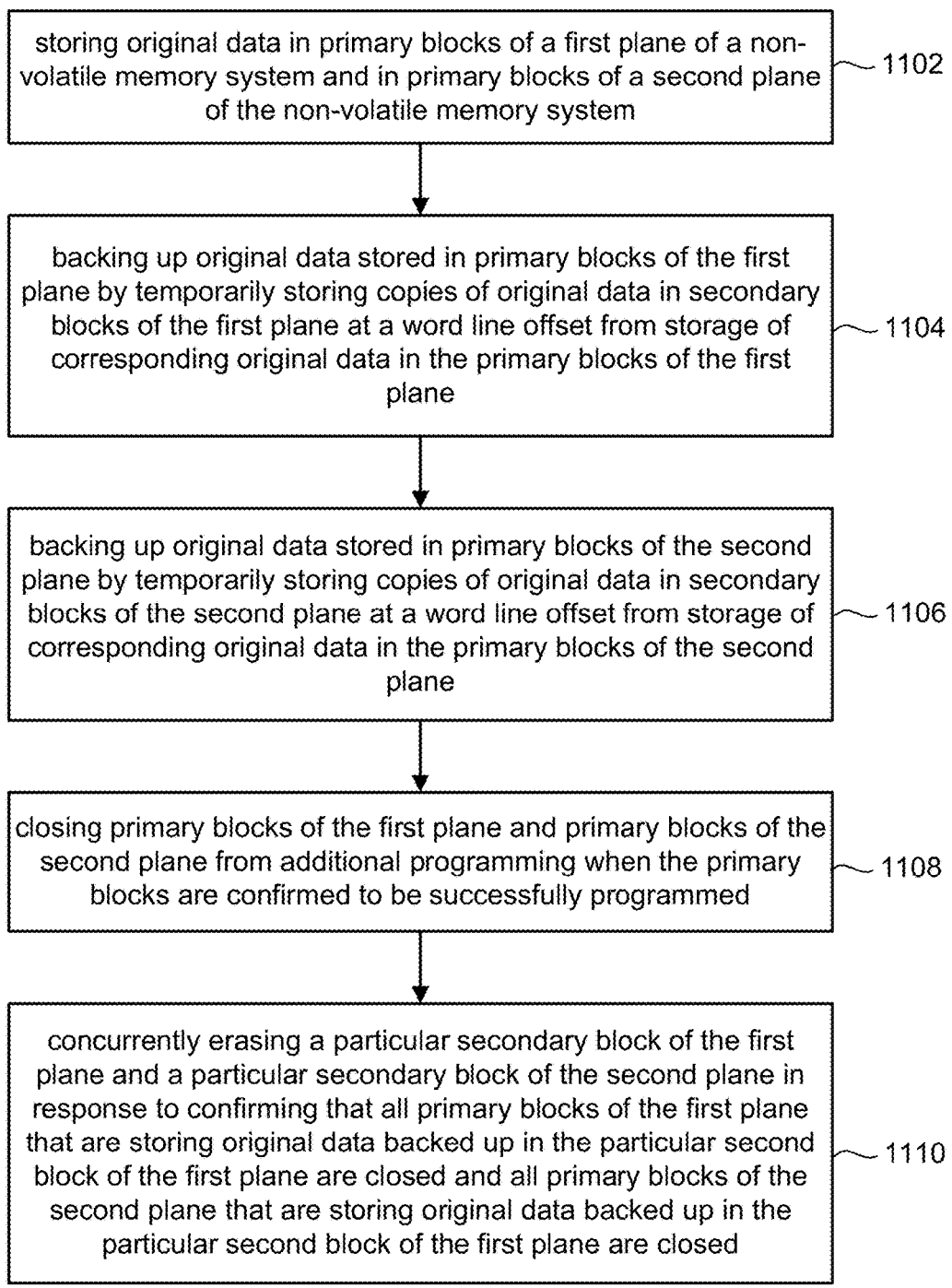
FIG. 15 is a flow chart describing one embodiment of a process for programming non-volatile storage.

FIG. 15 is a flowchart describing one embodiment for performing the processes of FIGS. 11 and 13 in a manner that coordinates the timing for erasing blocks from the temp pool TP for different planes. In one embodiment, the process of FIG. 15 is performed by a control circuit (see discussion above). In step 1102, original data is stored in primary blocks of a first plane of non-volatile memory system and in primary blocks of a second plane of non-volatile memory system. For example, step 1102 of FIG. 15 can include performing step 904 of FIG. 11 for multiple planes or any of steps 1004, 1010 or 1016 of FIG. 13 on different planes of a memory system. In step 1104 of FIG. 15, the system backs up original data stored in primary blocks of the first plane by temporarily storing copies of the original data in secondary blocks of the first plane at a word line offset from the storage of the corresponding original data in the primary blocks of the first plane. Step 1104 can be implemented by performing step 906 of FIG. 11 or steps 1006, 1012 and 1018 of FIG. 13. Step 1106 of FIG. 15 includes backing up original data stored in primary blocks of the second plane by temporarily storing copies of the original data in secondary blocks of the second plane at a word line offset from storage of corresponding original data in the primary blocks of the second plane. Step 1106 of FIG. 15 can be implemented by performing step 904 of FIG. 11 or steps 1006, 1012 and 1018 of FIG. 13. In step 1108, the system closes primary blocks of the first plane and primary blocks of the second plane from additional programming when the primary blocks are confirmed to be successfully programmed. In one example implementation, after confirming success in steps 908 of FIG. 11 or 1024 of FIG. 13, the primary blocks will be closed (e.g. placed in the closed pool CP in controller 122).

Step 1110 in FIG. 15 includes concurrently erasing a particular secondary block of the first plane and a particular secondary block of the second plane in response to confirming that all primary blocks of the first plane that are storing original data backed up in the particular second block of the first plane are closed and all primary blocks of the second plane that are storing original data backed up in the particular second plane of the first plane are closed. Step 1110 of FIG. 15 can be implemented as step 912 of FIG. 11 or step 1028 of FIG. 13. Alternatively, if the system determines that a particular set of original data did not program successfully into a particular primary block (as discussed above with respect to FIGS. 11 and 13), then in response thereto the system will recover an uncorrupted first portion of the particular set of original data from the particular primary block and recover an uncorrupted second portion of the particular set of original data from a secondary block storing a copy.

Figure 16:
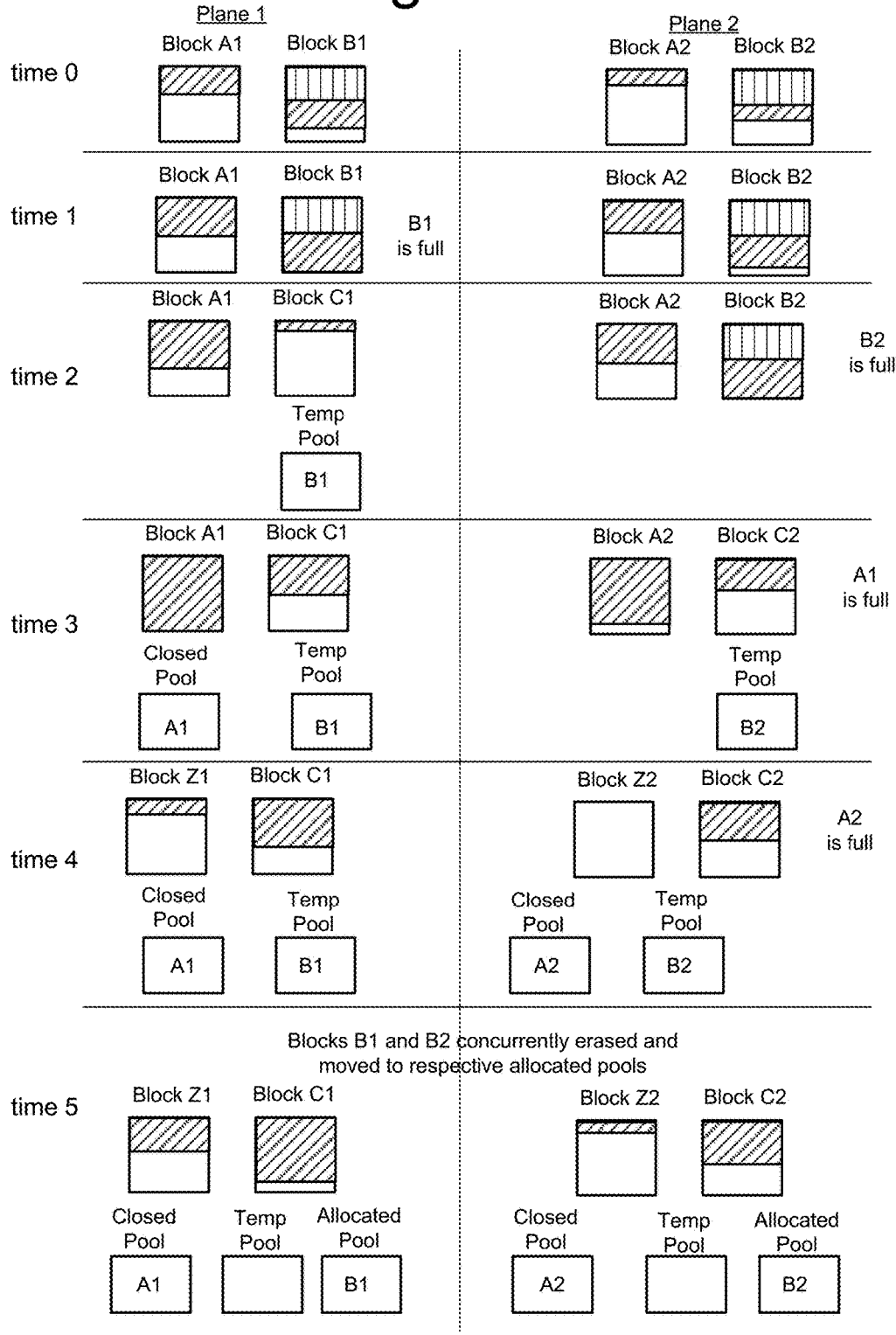
FIG. 16 is a block diagrams depicting blocks and data structures (e.g., lists) used by the controller during the process of FIG. 15.

FIG. 16 depicts various blocks of memory cells at different points during the process of FIG. 15. FIG. 16 shows those blocks at six points in time: time 0, time 1, time 2, time 3, time 4, and time 5. Time 0, time 1 and time 2 represent time during the concurrent performance of steps 1102, 1104 and 1106. Time 3 and time 4 occur during the performance of step 1108. Time 5 occurs during the performance of step 1110. The left side of FIG. 16 describes the state of blocks of memory cells in plane 1. The right side of FIG. 16 describes blocks of memory cells in plane 2.

At time 0 of FIG. 16 original data is being received and stored in primary block A1 in Plane 1 and original data is being received and stored in primary block A2 of Plane 2. The stream of data being stored in block A1 was started to be received prior to the data being starting to be received for block A2; therefore, at time 0 there is more data stored in block A1 than block A2, and block A1 is filling up faster than block A2. Secondary block B1 is concurrently being programmed to store a copy of the data being programmed into block A1 (as evidenced by the common shading). The top half of block B1 is storing earlier received data. The bottom portion of block B1 is receiving data as a copy of the data being programmed to block A1. Secondary block B2 is storing a copy of data being programmed to primary block A2. The top portion of block B2 is storing earlier received data. The bottom portion of block B2 is storing the copy of data being stored in block A2. Note that in this embodiment the secondary blocks are being programmed concurrently with the primary blocks. The same data may be programmed simultaneously in each block, or there can be a delay between the two blocks. Additionally, the data programmed into the secondary blocks might be a copy of the data sent to the primary blocks or might be read from the primary blocks and subsequently stored into the secondary blocks.

At time 1, block B1 is full; however, block B2 is not yet full because the data for block A2 was received slower than or after the data for block A2. At time 2, block B2 is now full. At this point, block B1 was placed into the temp pool TP. Additionally, a second portion of the copy of the data being stored in block A1 is now also being stored in block C1.

At time 3, block A1 is now full and block C1 is half full. Because block A1 is full, block A1 is placed in the closed pool CP. At this time, block B2 is in a temp pool TP for plane 2 because it previously was filled up.

At time T4, block A2 of Plane 2 is now full; therefore, block A2 is put into the closed pool CP for Plane 2. In plane 1, new data has been received for primary block C1 and a copy of that data is being stored at the bottom half of block C1. In plane 2, block C2 is getting ready to receive new data which will be backed up into block C2.

At this point in time, since blocks A1 and A2 have both been closed, the system can confirm successful programming for both blocks (e.g. steps 908 or 1024). Assuming that both blocks A1 and A2 have been confirmed to be successfully programmed, then blocks B1 and B2 are released (steps 912 or 1028) and erased. As discussed above with respect to FIG. 15 (step 1110), the two blocks B1 of Plane 1 and B2 of Plane 2 will be concurrently erased and then moved to the allocated pool so that they can be used as primary blocks. This is depicted at time 5 of FIG. 16 in which blocks A1 of Plane 1 and A2 of Plane 2 are in respective closed pools CP and blocks B1 and B2 are in respected allocated pools. Data is currently being received for block C1 and backed up in block C1, and data is being received from plane 2 for block Z2 and backed up into block C2.

In one embodiment, the reason for concurrently erasing blocks in different planes is because during an erase process, all of the planes of a memory die will stop programming and become idle. That is, if one plane is erasing, other planes will stop their programming until the erasing is complete. This helps maintain data queues at the controller. Note that the examples discussed above include memory dies with two planes; however, in other embodiments, more than two planes can be used. In those other embodiments, when there are more than two planes, the system will erase the blocks in the temporary pool concurrently for all planes. If the system does not erase blocks concurrently for all planes, then while a subset of blocks are erasing, the other subset of blocks are idle, which causes a slowdown in performance.

FIGS. 17A and 17B graphically depict how the concurrently erasing secondary blocks of different planes will increase performance. FIG. 17A shows an embodiment where secondary blocks of different planes are not concurrently erased. FIG. 17B depicts an embodiment where secondary blocks of different planes are concurrently erased. By comparing the two Figures, it can be seen that concurrently erasing secondary blocks at different planes increases the performance. For example, FIG. 17A shows that plane 1 will perform the following operations in this order: programming (P), erasing (E), programming (P), Idle, programming (P), erasing (E), programming (P), and Idle. Plane 2 will perform the following operations in this order: programming (P), Idle, programming (P), erasing (E), programming (P), Idle, programming (P), and erasing (E). For example, when Plane 1 starts its first erase operation, Plane 2 had to become idle. Similarly, when Plane 2 started its first erase operation Plane 1 had to become idle. These idle times slow down performance.

FIG. 17B shows an embodiment where secondary blocks at different planes are erased concurrently. Plane 1 performs the following operations in this order: programming (P), erasing (E), programming (P), erasing (E), and programming (P). Plane 2 performs the following operations: programming (P), erasing (E), programming (P), erasing (E), and programming (P). In the embodiment of FIG. 17B, both planes erase at the same time, so there is no need for the other plane to become idle. For example, erasing starts at time t1 and at time t2 for both Plane 1 and Plane 2. Therefore, the programming is completed at time t3 in the embodiment of FIG. 1B, while the programming is completed at time t4 for the embodiment of FIG. 17A.

The technology described above protects against physical defects that corrupt data programmed into the memory.

One embodiment includes a non-volatile storage apparatus, comprising a plurality of non-volatile memory cells grouped into blocks of memory cells and a control circuit in communication with the memory cells. The control circuit is configured to program first data to a first block of memory cells and program a copy of the first data across second and third blocks of memory cells such that a first portion of the copy of the first data is programmed into the second block and a second portion of the copy of the first data is programmed into the third block.

One embodiment includes a method of operating non-volatile storage, comprising: storing original data in primary blocks of a first plane of a non-volatile memory system and in primary blocks of a second plane of the non-volatile memory system; backing up original data stored in primary blocks of the first plane by temporarily storing copies of original data in secondary blocks of the first plane at a word line offset from storage of corresponding original data in the primary blocks of the first plane; backing up original data stored in primary blocks of the second plane by temporarily storing copies of original data in secondary blocks of the second plane at a word line offset from storage of corresponding original data in the primary blocks of the second plane; closing primary blocks of the first plane and primary blocks of the second plane from additional programming when the primary blocks are confirmed to be successfully programmed; and concurrently erasing a particular secondary block of the first plane and a particular secondary block of the second plane in response to confirming that all primary blocks of the first plane that are storing original data backed up in the particular second block of the first plane are closed and all primary blocks of the second plane that are storing original data backed up in the particular second block of the first plane are closed.

One embodiment includes non-volatile storage apparatus, comprising a plurality of non-volatile memory cells grouped into blocks of memory cells and a controller connected to the non-volatile memory cells. The controller comprises means for programming original data into blocks of memory cells, means for creating temporary backups of original data by storing copies of original data across multiple blocks at different offsets than corresponding original data and means for exchanging blocks from being used to store copies of original data as temporary backups to being used to store original data.

Examples of means for programming original data into blocks of memory cells include programming manager 236 of FIG. 2, media translation layer 238, ECC engine 224, firmware or software programming a processor implementing a controller, or state machine 122 performing the process of FIGS. 6A, 6B, 11, 13 and/or 15. The means for programming can be implemented by a dedicated electrical circuit or a combination of software programming an electrical circuit (e.g., a programmable processor).

Examples of means for creating temporary backups of original data by storing copies of original data across multiple blocks at different offsets than corresponding original data include programming manager 236 of FIG. 2, flash control layer 232, firmware or software programming a processor implementing a controller, or state machine 122 performing the process of FIGS. 6A, 6B, 11, 13 and/or 15. The means for creating can be implemented by a dedicated electrical circuit or a combination of software programming an electrical circuit (e.g., a programmable processor).

Examples of means for exchanging blocks from being used to store copies of original data as temporary backups to being used to store original data programming manager 236 of FIG. 2, firmware or software programming a processor implementing a controller, or state machine 122 performing the process of FIGS. 6A, 6B, 11, 13 and/or 15. The means for exchanging blocks can be implemented by a dedicated electrical circuit or a combination of software programming an electrical circuit (e.g., a programmable processor).

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a plurality of non-volatile memory cells grouped into blocks of memory cells; and
   a control circuit in communication with the memory cells, the control circuit configured to program first data to a first block of memory cells and program a copy of the first data across second and third blocks of memory cells such that a first portion of the copy of the first data is programmed into the second block and a second portion of the copy of the first data is programmed into the third block.

2. The non-volatile storage apparatus of claim 1, wherein:
   the first data is grouped into pages of data;
   the copy of the first data is grouped into pages of copied data; and
   the control circuit is configured to program the copy of the first data to the second block and the third block such that pages of copied data in the second block and pages of copied data in the third block are at a word line offset in comparison to corresponding pages of data in the first block.

3. The non-volatile storage apparatus of claim 1, wherein:
   the control circuit is configured to program the copy of the first data across second and third blocks of memory cells such the copy of first data is immediately adjacent to a copy of other second data with no intervening pseudo data between the copy of first data and the copy of other second data.

4. The non-volatile storage apparatus of claim 1, wherein:
   the control circuit is configured to program the copy of the first data across second and third blocks of memory cells such that a first half of the copy of the first data is programmed into the second block and a second half of the copy of the first data is programmed into the third block.

5. The non-volatile storage apparatus of claim 1, wherein:
   the first portion of the copy of the first data is stored contiguously in the second block and the second portion of the copy of the first data is stored contiguously in the third block.

6. The non-volatile storage apparatus of claim 1, wherein:
   the control circuit configured to program second data to a fourth block of memory cells and program a copy of the second data across the third block and a fifth block of memory cells such that a first portion of the copy of the second data is programmed into the third block and a second portion of the copy of the second data is programmed into the fifth block.

7. The non-volatile storage apparatus of claim 6, wherein:
   the control circuit configured to confirm successful programming of the first data in the first block of memory cells and the second data in the fourth block of memory cells; and
   the control circuit configured to release and erase the third block of memory cells in response to successful programming of the first data in the first block of memory cells and the second data in the fourth block of memory cells.

8. The non-volatile storage apparatus of claim 7, wherein:
   the control circuit configured to use the released third block of memory cells to store third data and to temporarily backup the third data in other blocks of memory cells.

9. The non-volatile storage apparatus of claim 1, wherein:
   the control circuit is configured to determine that the programming of the first data in the first block of memory cells is unsuccessful; and
   in response to determining that the programming of the first data in the first block of memory cells is unsuccessful, the control circuit is configured to recover a first subset of the first data from the first block and a second subset of the first data from either the second block or the third block.

10. The non-volatile storage apparatus of claim 1, wherein:
    the control circuit is configured to determine that the programming of the first data in the first block of memory cells is unsuccessful; and
    in response to determining that the programming of the first data in the first block of memory cells is unsuccessful, the control circuit is configured to recover at least a subset of the first data from either the second block or the third block.

11. The non-volatile storage apparatus of claim 1, wherein:
    the control circuit is configured to program the first data to the first block of memory cells as one bit per memory cell;
    the control circuit is further configured to program additional data to additional blocks of memory cells as one bit per memory cell and program copies of the additional data to other blocks of memory cells; and
    the control circuit is further configured to combine the first data from the first block of memory cells with the additional data from the additional blocks of memory cells as multiple bits per memory cell and store that combined data as multiple bits per memory cell in a target block of memory cells.

12. The non-volatile storage apparatus of claim 1, wherein:
- the plurality of non-volatile memory cells form multiple planes, each plane includes multiple blocks of memory cells; and
- the control circuit is configured to concurrently erase blocks of memory cells from different planes that are storing copies of data all of which has been confirmed to have been programmed successfully into other target blocks.

13. The non-volatile storage apparatus of claim 1, wherein:
- the plurality of non-volatile memory cells form three dimensional memory arrays on multiple memory die; and
- the control circuit includes a controller that is separate from, and connected to, the multiple memory die.

14. An apparatus, comprising:
- a control circuit configured to communicate with a plurality of non-volatile memory cells grouped into blocks of memory cells, the control circuit configured to program first data to a first block of memory cells and program a copy of the first data across second and third blocks of memory cells such that a first portion of the copy of the first data is programmed into the second block and a second portion of the copy of the first data is programmed into the third block.

15. The apparatus of claim 14, wherein:
- the first data is grouped into pages of data;
- the copy of the first data is grouped into pages of copied data; and
- the control circuit is configured to program the copy of the first data to the second block and the third block such that pages of copied data in the second block and pages of copied data in the third block are at a word line offset in comparison to corresponding pages of data in the first block.

16. The apparatus of claim 14, wherein:
- the control circuit is configured to program second data to a fourth block of memory cells and program a copy of the second data across the third block and a fifth block of memory cells such that a first portion of the copy of the second data is programmed into the third block and a second portion of the copy of the second data is programmed into the fifth block.

17. The apparatus of claim 16, wherein:
- the control circuit is configured to confirm successful programming of the first data in the first block of memory cells and the second data in the fourth block of memory cells; and
- the control circuit is configured to release and erase the third block of memory cells in response to successful programming of the first data in the first block of memory cells and the second data in the fourth block of memory cells.

18. An apparatus, comprising:
- a memory interface configured to communicate with a plurality of non-volatile memory cells grouped into blocks of memory cells; and
- one or more processors configured to communicate with the memory cells using the memory interface, the one or more processors configured to program first data to a first block of memory cells and program a copy of the first data across second and third blocks of memory cells such that a first portion of the copy of the first data is programmed into the second block and a second portion of the copy of the first data is programmed into the third block.

19. The apparatus of claim 18, wherein:
- the first data is grouped into pages of data;
- the copy of the first data is grouped into pages of copied data; and
- the one or more processors are configured to program the copy of the first data to the second block and the third block such that pages of copied data in the second block and pages of copied data in the third block are at a word line offset in comparison to corresponding pages of data in the first block.

\* \* \* \* \*